(12) United States Patent
Hersam et al.

(10) Patent No.: US 10,550,003 B2
(45) Date of Patent: Feb. 4, 2020

(54) ELECTRONICALLY ABRUPT BOROPHENE/ORGANIC LATERAL HETEROSTRUCTURES AND PREPARATION THEREOF

(71) Applicant: Northwestern University, Evanston, IL (US)

(72) Inventors: Mark C. Hersam, Wilmette, IL (US); Xiaolong Liu, Evanston, IL (US)

(73) Assignee: NORTHWESTERN UNIVERSITY, Evanston, IL (US)

( * ) Notice: Subject to any disclaimer, the term of this patent is extended or adjusted under 35 U.S.C. 154(b) by 0 days.

(21) Appl. No.: 15/892,124

(22) Filed: Feb. 8, 2018

(65) Prior Publication Data

US 2018/0222755 A1   Aug. 9, 2018

Related U.S. Application Data

(60) Provisional application No. 62/499,938, filed on Feb. 8, 2017.

(51) Int. Cl.
| | |
|---|---|
| *C01B 35/04* | (2006.01) |
| *H01L 51/00* | (2006.01) |
| *C23C 16/04* | (2006.01) |
| *C23C 16/22* | (2006.01) |

(52) U.S. Cl.
CPC ............ *C01B 35/04* (2013.01); *C23C 16/04* (2013.01); *C23C 16/22* (2013.01); *H01L 51/0011* (2013.01); *H01L 51/0096* (2013.01); *C01P 2002/20* (2013.01); *C01P 2002/60* (2013.01); *C01P 2004/90* (2013.01); *C01P 2006/40* (2013.01); *C01P 2006/90* (2013.01); *H01L 51/0053* (2013.01); *H01L 2251/301* (2013.01)

(58) Field of Classification Search
CPC ......... C01B 35/04; C23C 14/04; C23C 14/12; C23C 16/04; C23C 16/22; H01L 51/0011; H01L 51/008; H01L 51/0096; H01L 51/0053; H01L 2251/301; C01P 2002/20; C01P 2002/60; C01P 2004/90; C01P 2006/40; C01P 2006/90
USPC .......................................................... 252/500
See application file for complete search history.

(56) References Cited

U.S. PATENT DOCUMENTS

| | | | |
|---|---|---|---|
| 2011/0204416 A1 | 8/2011 | Forrest et al. | |
| 2013/0207047 A1 | 8/2013 | Suda et al. | |
| 2014/0256096 A1* | 9/2014 | Koezuka | H01L 27/1288 438/163 |
| 2015/0123079 A1 | 5/2015 | Kim et al. | |
| 2016/0178569 A1* | 6/2016 | Hoffman | G01N 27/4146 257/29 |

OTHER PUBLICATIONS

International Search Report and Written Opinion for PCT/US2018/017444 dated May 24, 2018, 17 pages.

Mannix, A.J. et al., "Synthesis of borophenes: Anisotropic, two-dimensional boron polymorphs", Science 350, 1513-1516 (2015).

(Continued)

*Primary Examiner* — Mark Kopec
(74) *Attorney, Agent, or Firm* — Locke Lord LLP; Tim Tingkang Xia, Esq.

(57) ABSTRACT

Articles comprising a boron allotrope and an organic compound having a lateral interface one with the other, together with method(s) of preparation of such articles.

20 Claims, 29 Drawing Sheets
(29 of 29 Drawing Sheet(s) Filed in Color)

(56) References Cited

OTHER PUBLICATIONS

Feng, B. et al., "Experimental realization of two-dimensional boron sheets", Nat. Chem. 8, 563-568 (2016).
Feng, B. et al., "Direct evidence of metallic bands in a monolayer boron sheet", Phys. Rev. B 94, 041408 (2016).
Zhang, Z. et al., "Substrate-Induced Nanoscale Undulations of Borophene on Silver", Nano Lett. 16, 6622-6627 (2016).
Tai, G. et al., "Synthesis of Atomically Thin Boron Films on Copper Foils", Angewandte Chemie 127, 15693 (2015).
Zhang, Z. et al., "Two-Dimensional Boron Monolayers Mediated by Metal Substrates", Angewandte Chemie 127, 13214 (2015).
Liu, Y. et al., "Probing the Synthesis of Two-Dimensional Boron by First-Principles Computations", Angewandte Chemie 52, 3156 (2013).
Amsler, M. et al., "Conducting Boron Sheets Formed by the Reconstruction of the alpha-Boron (111) Surface", Phys. Rev. Lett. 111, 136101 (2013).
Temirov, R. et al., "Free-electron-like dispersion in an organic monolayer film on a metal substrate", Nature 444, 350-353 (2006).
Eremtchenko, M. et al., "Understanding and tuning the epitaxy of large aromatic adsorbates by molecular design", Nature 425, 602-605 (2003).
Huang, C. et al., "Lateral heterojunctions within monolayer MoSe2—WSe2semiconductors", Nat. Mater. 13, 1096-1101 (2014).
Sutter, P. et al., "Interface Formation in Monolayer Graphene-Boron Nitride Heterostructures", Nano Lett. 12, 4869-4874 (2012).
Li, M.Y. et al., "Epitaxial growth of a monolayer WSe2—MoS2lateral p-n junction with an atomically sharp interface", Science 349, 524-528 (2015).
Dhar, B.M. et al., "Field-effect-tuned lateral organic diodes", Proc. Natl. Acad. Sci. U.S.A. 107, 3972-3976 (2010).
Li, W.L. et al., "The B35 Cluster with a Double-Hexagonal Vacancy: A New and More Flexible Structural Motif for Borophene", J. Am. Chem. Soc. 136, 12257 (2014).

\* cited by examiner

Ag: $18k_BT$, B: $10k_BT$

Ag: $18k_BT$, B: $16k_BT$

US 10,550,003 B2

ELECTRONICALLY ABRUPT BOROPHENE/ORGANIC LATERAL HETEROSTRUCTURES AND PREPARATION THEREOF

This application claims priority to and the benefit of application Ser. No. 62/499,938 filed on Feb. 8, 2017, the entirety of which is incorporated herein by reference.

This invention was made with government support under N00014-14-1-0669 awarded by the Office of Naval Research and DMR-1121262 awarded by the National Science Foundation. The government has certain rights in the invention.

BACKGROUND OF THE INVENTION

The rapid ascent of graphene has driven extensive interest in additional atomically thin elemental two-dimensional (2D) materials including phosphorene, stanene, and most recently, borophene. (See, A. J. Mannix, X.-F. Zhou, B. Kiraly, J. D. Wood, D. Alducin, B. D. Myers, X. Liu, B. L. Fisher, U. Santiago, J. R. Guest, M. J. Yacaman, A. Ponce, A. R. Oganov, M. C. Hersam, N. P. Guisinger, Synthesis of borophenes: Anisotropic, two-dimensional boron polymorphs, *Science* 350, 1513-1516 (2015)). Unlike the naturally layered structures of bulk graphite and black phosphorus, boron exhibits significantly more complex and diverse bulk structures due to the rich bonding configurations among boron atoms. Studies of atomically thin boron sheets (i.e., borophene) primarily relied on theoretical predictions until recent studies experimentally demonstrated borophene synthesis on Ag(111) substrates. These experimental studies have confirmed theoretical predictions that borophene is a 2D metal and can adopt multiple structurally distinct phases as a function of processing conditions.

As an emerging 2D material, borophene has thus far only been studied in isolation, whereas nearly all technological applications will require the integration of borophene with other materials. Of particular interest are electronically abrupt lateral heterostructures, which have been widely explored in other 2D materials due to their novel electronic properties. For example, atomically well-defined lateral heterostructures between graphene and hexagonal boron nitride have revealed spatially confined boundary states with scanning tunneling spectroscopy (STS). It should be noted, however, that methods for experimentally realizing atomically clean and abrupt lateral heterojunctions remain challenging for many 2D material systems. For example, the growth front of the first 2D material can be easily contaminated, which can disrupt the subsequent growth of the second 2D material and/or lead to ill-defined interfacial regions. Alloying and intermixing during the growth of 2D material lateral heterostructures also prevents abrupt interfaces.

SUMMARY OF THE INVENTION

In light of the foregoing, it can be an object of the present invention to provide lateral heterostructures comprising borophene and/or related boron allotropes and/or method(s) for a preparation thereof, thereby overcoming various deficiencies and shortcomings of the prior art, including those outlined above. It will be understood by those skilled in the art that one or more aspects of this invention can meet certain objectives, while one or more other aspects can meet certain other objectives. Each objective may not apply equally, in all its respects, to every aspect of this invention. As such, the following objects can be viewed in the alternative with respect to any one aspect of this invention.

It can be an object of the present invention to provide articles of manufacture comprising lateral heterostructures comprising an atomically-thin boron allotrope, for instance and without limitation, a two-dimensional boron sheet (i.e., borophene) and another material.

It can be another object of the present invention to provide such heterostructures without alloying or boron compound formation.

It can be another object of the present invention, alone or in conjunction with one or more of the preceding objectives, to provides a well-defined lateral interface of boron with another such material at nanometric molecular length scales.

Other objects, features, benefits and advantages of the present invention will be apparent from this summary and the following descriptions of various preferred embodiments, and will be readily apparent to those skilled in the art having knowledge of elemental boron, nano-dimensioned allotropes thereof, related heterostructures and/or method(s) of preparation. Such objects, features, benefits and advantages will be apparent from the above as taken into conjunction with the accompanying examples, data, figures and all reasonable inferences to be drawn therefrom, alone or with consideration of the references incorporated herein.

In part, the present invention can be directed to an article comprising a substrate; a boron allotrope comprising an elemental boron layer of boron atoms comprising a boron atomic thickness dimension; and an organic compound layer, said boron allotrope layer and said organic compound layer on and/or coupled to said substrate, laterally adjacent one to the other and providing a lateral interface one with the other. Without limitation, such an allotrope can be two-dimensional borophene and, independently, such an organic compound can be a polycyclic aromatic compound comprising one or more moieties affording such a compound a capability for intermolecular hydrogen bonding, such a moiety including but not limited to one or more carboxylic acid anhydride moieties, such polycyclic aromatic compounds and moieties thereof as would be understood by those skilled in the art and made aware of this invention. As a separate consideration, such a substrate can comprise a noble metal.

In certain non-limiting embodiments, such an organic compound can comprise a self-assembly product of perylene-3,4,9,10-tetracarboxylic dianhydride (PTCDA). As an independent consideration, such a substrate can be silver. Certain such embodiments can comprise a single crystal Ag(111). In certain other non-limiting embodiments, such a boron allotrope can comprise a homogeneous boron phase. In certain such embodiments, such a boron allotrope can be metallic and, independently, such an organic compound can be semiconducting. Without limitation, such an organic compound can comprise a self-assembly product of PTCDA.

Regardless, without limitation, such an article can comprise such a boron allotrope substantially absent such an organic compound thereon. As can relate thereto, such a lateral interface can be characterized by complete structural and/or electronic transition from such a boron allotrope to such an organic compound layer over the nanometric length scale of such an organic compound.

In part, the present invention can also be directed to an article comprising a silver substrate; a metallic boron allotrope comprising an elemental boron layer of boron atoms comprising a boron atomic thickness dimension; and a semiconducting organic compound monolayer comprising a self-assembly product of PTCDA, such boron allotrope and organic compound layers on and/or coupled to such a substrate, laterally adjacent one to the other and providing a non-covalent lateral interface one with the other. In certain non-limiting embodiments, such a substrate can comprise single crystal Ag(111). In certain such embodiments, such a boron allotrope can comprise a homogeneous boron phase.

In part, the present invention can also be directed to the preparation and/or the self-assembly of lateral heterostructures comprising a boron allotrope and/or a borophene and an organic material such as but not limited to PTCDA. Accordingly, such a method of preparing such a lateral heterostructural article can comprise providing an article comprising a substrate comprising a portion thereof coupled to a boron allotrope comprising an elemental boron layer; generating an organic compound vapor from a solid organic compound source, such an organic compound vapor having a higher enthalpy of adsorption on such a substrate compared to enthalpy of adsorption on such a boron allotrope; and contacting such an organic compound vapor with such an article to selectively deposit such an organic compound on a substrate portion not coupled to such a boron allotrope, to provide a heterostructural article comprising such an organic compound and such a boron allotrope laterally adjacent one to the other and providing a lateral interface one with the other. Without limitation, such deposition can provide complete structural and/or electronic transition from such a boron allotrope to an organic compound layer over the nanometric length scale of such an organic compound. As can relate thereto, such a method can utilize intermolecular hydrogen bonding to prepare such a lateral heterostructural article. Such a method can be as described above, with generation of an organic compound vapor from a solid organic compound source capable of lateral intermolecular hydrogen bonding, to selectively deposit such an organic compound on a substrate portion not coupled to such a boron allotrope.

Without limitation to any one theory or mode of operation, such lateral heterostructures can spontaneously form, for instance, upon deposition of PTCDA on submonolayer borophene on Ag(111) substrates due to the higher adsorption enthalpy of PTCDA on Ag(111) and lateral hydrogen bonding among PTCDA molecules, as can be demonstrated by molecular dynamics simulations. In situ X-ray photoelectron spectroscopy confirms the non-covalent interaction between borophene and PTCDA, while molecular-resolution ultrahigh vacuum scanning tunneling microscopy and spectroscopy reveal an electronically abrupt interface at the borophene/PTCDA lateral heterostructure interface.

BRIEF DESCRIPTION OF THE DRAWINGS

The patent or application file contains at least one drawing executed in color. Copies of this patent or patent application publication with color drawing(s) will be provided by the office upon request and payment of the necessary fee.

where $z_{min}$ is the distance at which the central bead of the PCTDA molecule and a Ag atom are touching and $z_{max}$ is the top of the simulation cell. The single-molecule simulation results are obtained by directly sampling the position of a single molecule in a canonical MD simulation. The agreement between the results obtained by direct sampling and thermodynamic integration confirms the calculation of $\Delta G(z)$.

Figure 14A:
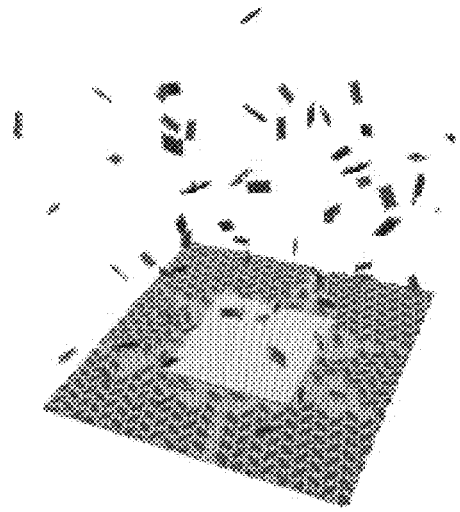
Figure 14B:
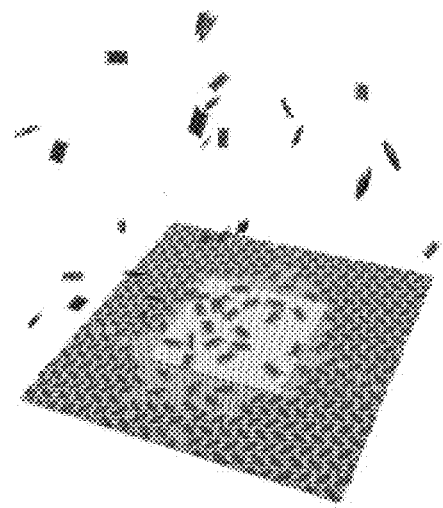

FIGS. 14A-B. Additional simulated adsorption of PTCDA on borophene/Ag(111). Self-assembled structure of PTCDA on heterogeneous borophene/Ag(111) substrates with (A) $\Delta H_{ads,Ag}$=18 $k_B T$, $\Delta H_{ads,B}$=10 $k_B T$, and (B) $\Delta H_{ads,Ag}$=18 $k_B T$, $\Delta H_{ads,B}$=16 $k_B T$. The fact that no PTCDA adsorption is seen in (A) but in (B) indicates that the required adsorption enthalpy differential for PTCDA on Ag(111) and borophene is between 2 and 8 $k_B T$ for fully selective adsorption of PTCDA on Ag(111).

FIGS. 15A-F. Spectroscopic properties of the borophene/PTCDA lateral heterostructure. (A) In situ XPS spectra of the B 1s core-level, and (B) C 1s core-level before and after the formation of the borophene/PTCDA lateral heterostructure. (C) Differential tunneling conductance spectra of Ag(111), borophene, and PTCDA. (D) STS digital map of a borophene/PTCDA lateral heterostructure overlaid on a three-dimensionally rendered STM topography image ($V_s$=−1 V, $I_t$=90 pA). (E) Spatially resolved STS spectra across the interfaces (STM digital images) of borophene/Ag, and (F) borophene/PTCDA. The vertical black lines in (E) and (F) indicate the positions of the Ag surface state feature and the LUMO+1 orbital of PTCDA far from the borophene/Ag and borophene/PTCDA interfaces, respectively.

Figure 16:
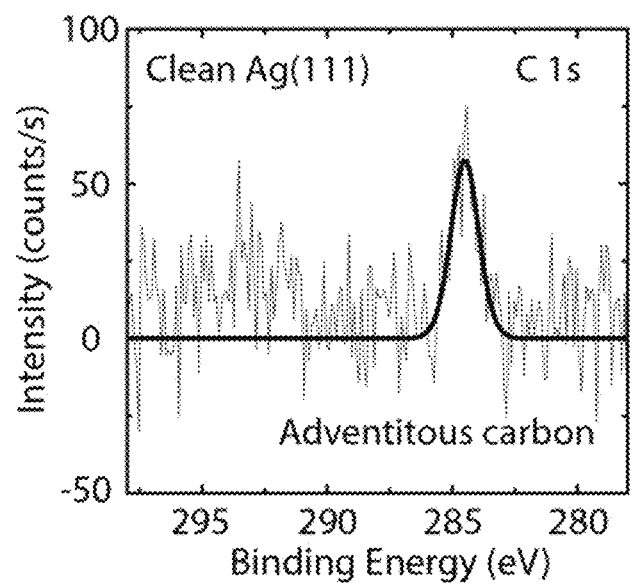
Figure 17A:
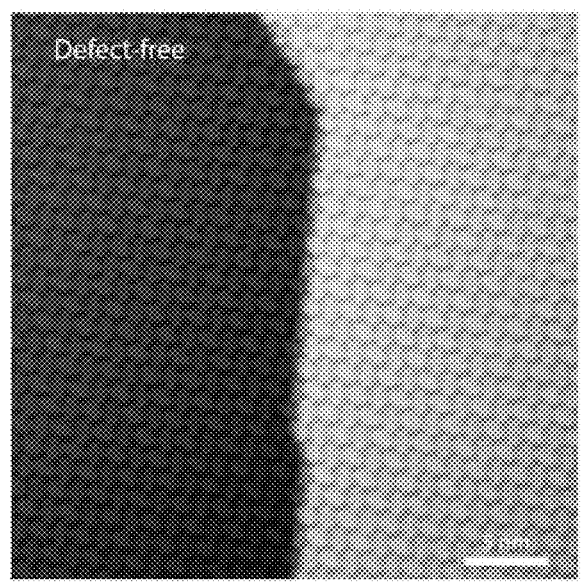
Figure 17B:
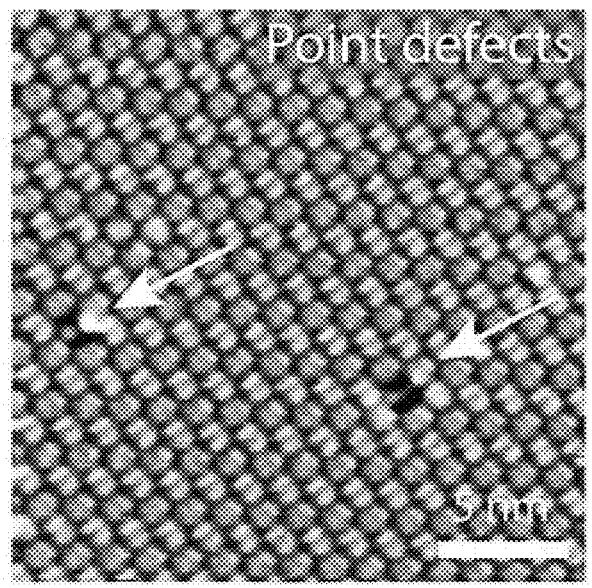
Figure 17C:
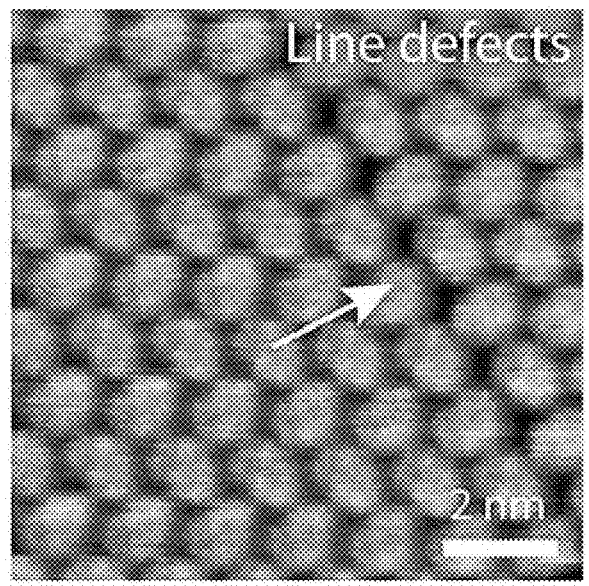
Figure 17D:
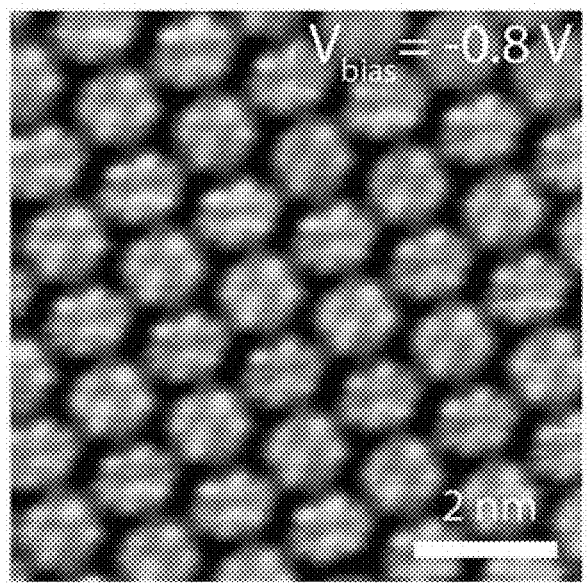
Figure 17E:
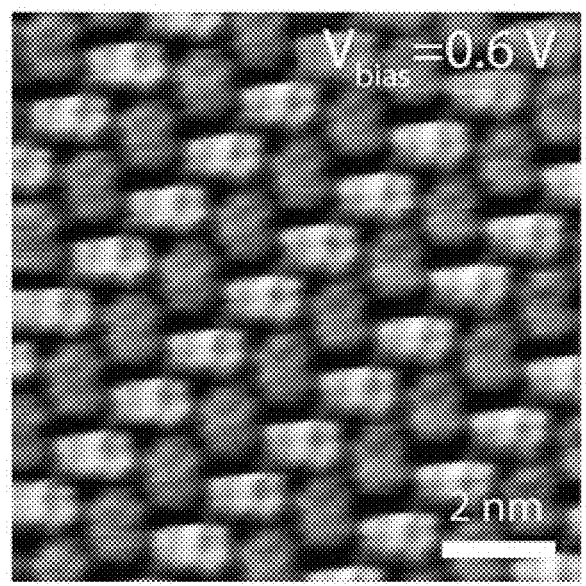

FIG. 16. C 1s core-level XPS spectrum of a clean Ag (111) surface. A trace amount of carbon is present (284.5 eV), likely due to adventitious carbon in the ultra-high vacuum chamber.

FIGS. 17A-E. STM digital images of self-assembled PTCDA on Ag(111). (A) A large area of defect-free PTCDA monolayer showing the herringbone structure across a Ag(111) step edge ($V_b$=−0.71 V, $I_t$=50 pA). (B) Point defects ($V_b$=−1.07 V, $I_t$=50 pA) and (C) line defects in PTCDA monolayers as indicated by the white arrows ($V_b$=−1.75 V, $I_t$=140 pA). (D) STM digital image of PTCDA imaged at sample bias of −0.8 V and (E) 0.6 V showing different molecular and sub-molecular contrast.

DETAILED DESCRIPTION OF CERTAIN EMBODIMENTS

Relating to one or more non-limiting embodiments thereof, this invention can be illustrated by the first experimental demonstration and characterization of a boron allotrope and/or borophene lateral heterostructure with a representative organic material, the molecular semiconductor perylene-3,4,9,10-tetracarboxylic dianhydride (PTCDA). In accordance with broader aspects of this invention, submonolayer homogeneous-phase borophene is initially grown on Ag(111) on mica substrates by electron-beam evaporation of a pure boron source, resulting in atomically pristine 2D boron sheets as confirmed by in situ X-ray photoelectron spectroscopy (XPS). Subsequent deposition of PTCDA results in preferential assembly on Ag(111), ultimately resulting in the presence of dense and well-ordered PTCDA monolayers that form lateral heterostructures with the borophene flakes. PTCDA is known to self-assemble on a variety of substrates including metals, semimetals, semiconductors, oxides, and salt crystals. The fact that PTCDA does not self-assemble on borophene is thus unexpected, but leads to the desirable formation of lateral heterostructures with borophene.

It has been reported in the literature that the electronic properties of self-assembled monolayers can be tuned by neighboring materials. In particular, the noncovalent interaction of PTCDA with silver substrates leads to a delocalized 2D band state with a parabolic dispersion. It should also be noted that noncovalent van der Waals interactions are prevalent in electronic devices based on 2D and mixed-dimensional heterostructures. For example, van der Waals coupled organic lateral heterostructures have been demonstrated as gate-tunable p-n diodes. It has also been reported that van der Waals coupled electronic states play an important role in determining the electronic structure and optical properties of double-walled carbon nanotubes. For the case of borophene and PTCDA, in situ XPS verifies the absence of covalent bonding between borophene and PTCDA since the B 1s peak remains virtually unchanged following the formation of borophene/PTCDA lateral heterostructures. Using molecular dynamics (MD) simulations, these observations are consistent with a lower adsorption enthalpy of PTCDA on borophene and the formation of a hydrogen bonding network between adsorbed PTCDA molecules. Ultrahigh vacuum (UHV) scanning tunneling microscopy (STM) and STS measurements further show that these lateral borophene/PTCDA heterostructures are electronically abrupt at the molecular-scale. In addition to elucidating the unique chemistry of borophene, this work has clear implications for borophene-based nanoelectronics.

Homogeneous-Phase Borophene.

Figure 1A:
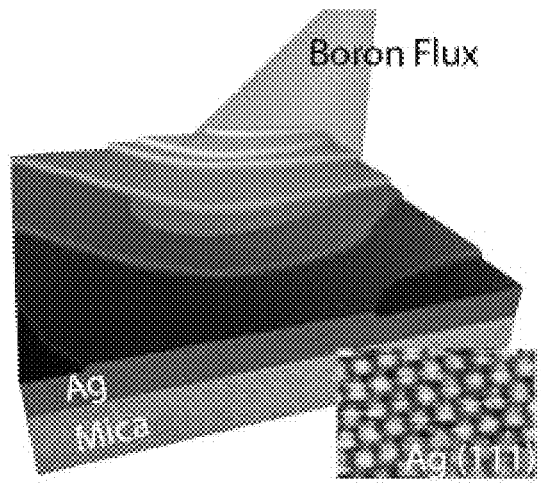
FIGS. 1A-D. Homogeneous-phase borophene. (A) Schematic of borophene growth on Ag(111) thin film on mica. Inset: atomic resolution STM image of the Ag(111) surface ($V_s=0.01$ V, $I_t=100$ pA). (B) STM digital image of triangular borophene islands on Ag(111). Under these imaging conditions ($V_s=1.2$ V, $I_t=160$ pA), the borophene islands appear as depressions. (C) In situ XPS spectra of the B 1s core-level on pristine borophene (top) and Ag 3d core-levels (vertically offset) before and after borophene growth (bottom). (D) Ex-situ AFM digital image of borophene/Ag(111) with borophene islands appearing as protrusions.
Figure 1B:
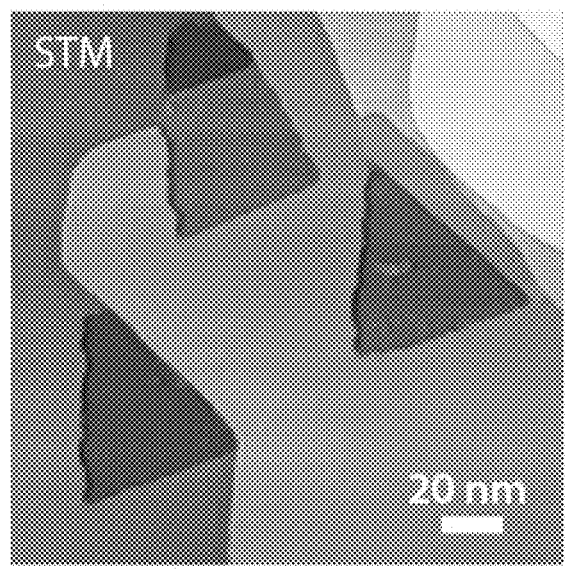

The growth of borophene is schematically shown in FIG. 1A, where a boron flux created by electron-beam evaporation of a pure boron rod is directed toward a Ag(111) thin film (~300 nm thick) on mica substrate in UHV. The inset shows an atomic resolution STM image of the atomically clean Ag(111) surface preceding boron deposition. By maintaining the substrate at a temperature of ~480° C., pure homogeneous-phase borophene (i.e., the common phase realized in the initial experimental reports of borophene) is realized with surface coverage controlled by the deposition duration. The STM image in FIG. 1B shows a representative morphology of the resulting borophene growth both on and across atomically flat Ag(111) terraces. Atomic-scale STM imaging indicates a carpet-mode growth of homogeneous-phase borophene (FIG. 2), which was previously observed for striped-phase borophene. Due to the convolution of electronic and physical structure in STM imaging, the borophene islands appear as depressions at these STM imaging conditions, which is consistent with previous reports. Furthermore, the borophene islands adopt elongated or truncated triangular shapes with aligned edges, which suggests registry between borophene and the underlying Ag(111) substrate.

Figure 1C:
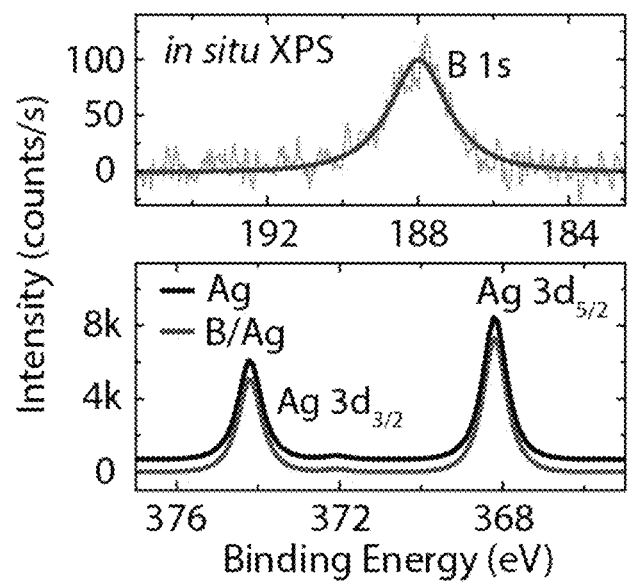
Figure 1D:
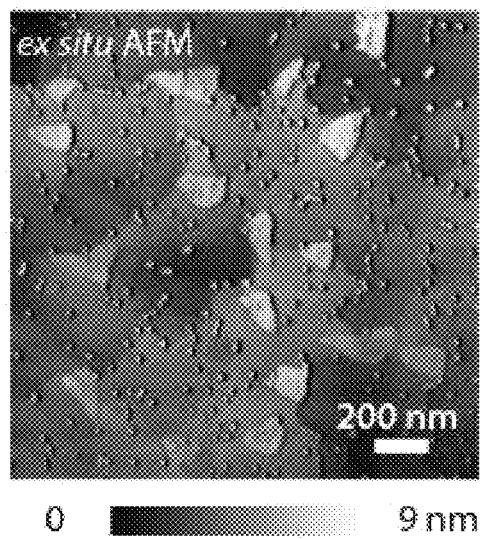
Figure 2A:
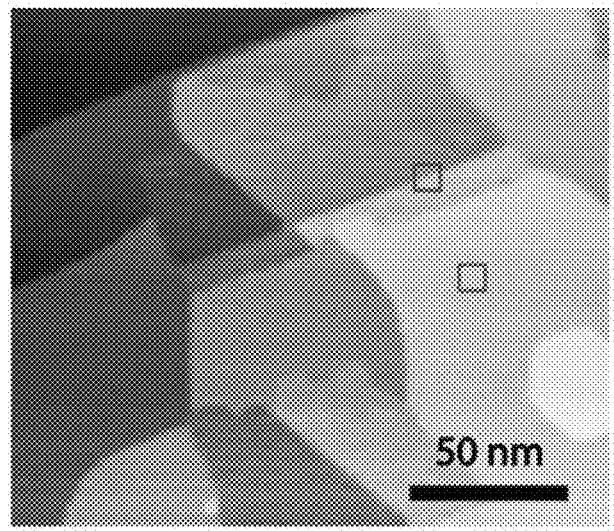
FIGS. 2A-F. Carpet-mode growth of homogeneous phase borophene. (A) Scanning tunneling microscopy (STM) digital image of borophene islands covering Ag(111) step edges ($V_b=1.5$ V, $I_t=50$ pA). (B) Atomic resolution STM digital image of homogeneous-phase borophene growing on a Ag terrace (lower square in (A), $V_b=-0.2$ V, $I_t=50$ pA). (C) STM digital image of homogeneous-phase borophene continuously growing over a Ag(111) step edge (upper square in (A), $V_b=-0.2$ V, $I_t=50$ pA). This image confirms that homogeneous-phase borophene adopts carpet-mode growth as has been previously observed for striped-phase borophene. (D-F) Additional large-scale STM digital images of homogeneous-phase borophene growing on and continuously across Ag(111) terraces. The borophene islands in (E) and (F) are outlined by white dashed lines. Ag steps are discontinuous when they cross borophene islands, presumably due to migration of the Ag terraces during borophene growth at elevated temperatures ((D): $V_b=0.8$ V, $I_t=50$ pA, (E): $V_b=1.2$ V, $I_t=50$ pA, (F): $V_b=0.91$ V, $I_t=50$ pA).
Figure 2B:
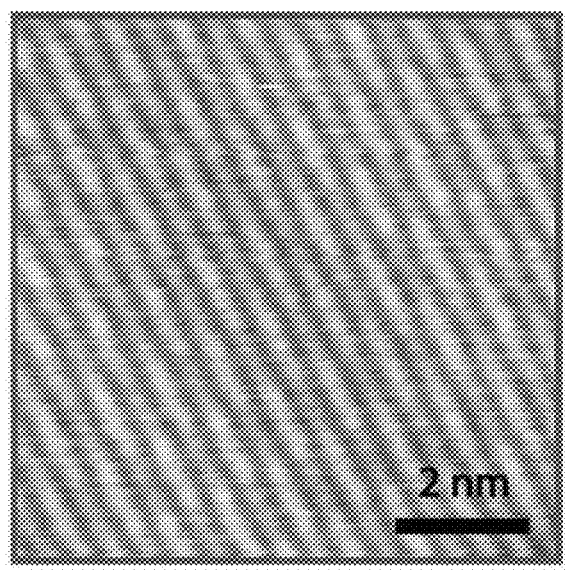
Figure 2C:
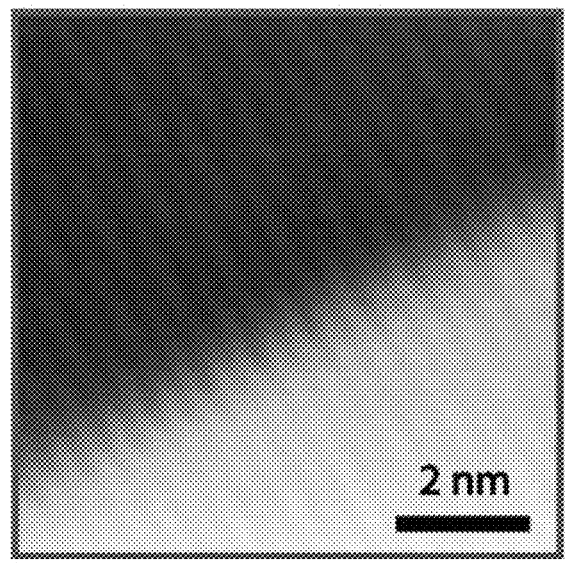
Figure 2D:
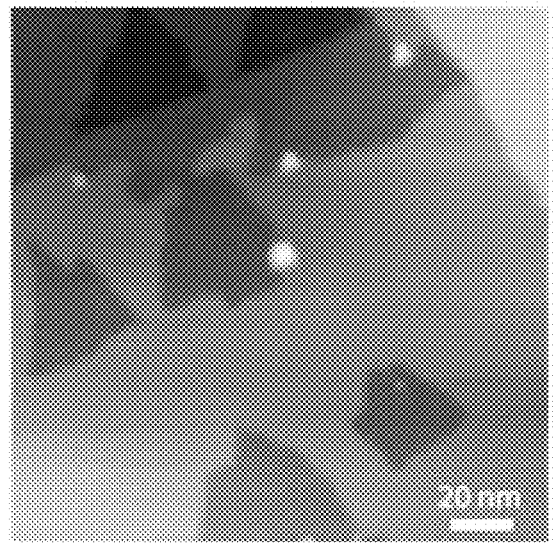
Figure 2E:
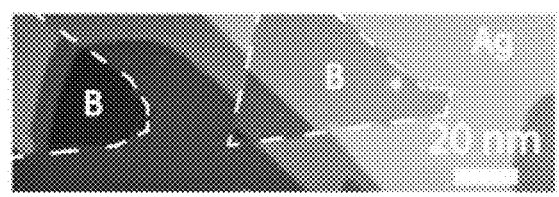
Figure 2F:
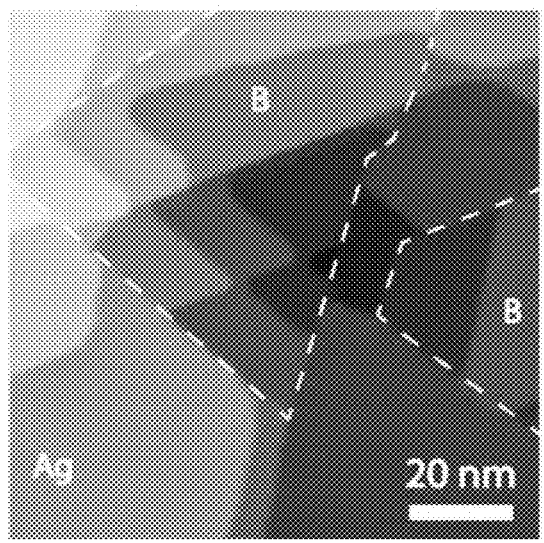
Figure 3A:
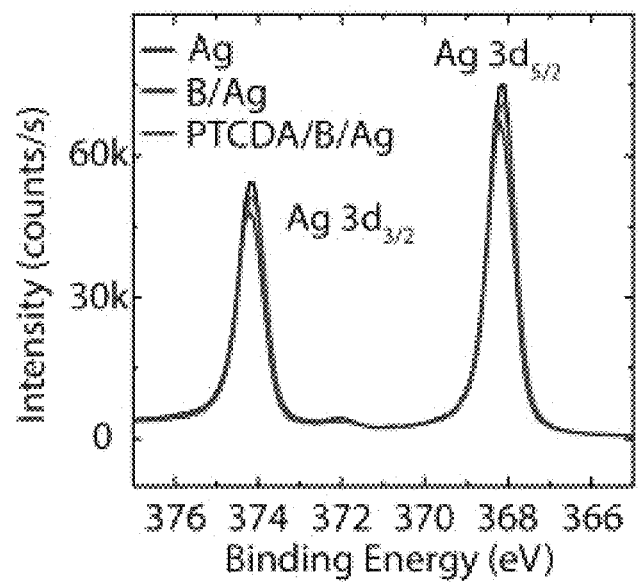
FIGS. 3A-B. X-ray photoelectron spectra (XPS) of Ag 3d and O 1s core-levels. (A) Ag 3d core-level XPS spectra of clean Ag, borophene/Ag, and PTCDA/borophene/Ag (Ag $3d_{5/2}$: 368.2 eV, Ag $3d_{3/2}$: 374.2 eV, plasma loss peak of Ag 3d5/2: 372.0 eV. The full widths at half maximum for all three Ag $3d_{5/2}$ peaks are 0.68 eV. Since the amount of adventitious carbon is small in these samples, all three spectra were charge-corrected by the same amount as determined by the Ag $3d_{5/2}$ peak position of clean Ag(111). No detectable shift of the peak positions is observed after borophene growth. Following the formation of borophene/PTCDA lateral heterostructures, the Ag $3d_{5/2}$ is upshifted by 0.04 eV, which is negligible compared to the instrumental energy resolution of 0.6 eV, but could be consistent with a higher binding energy due to electron transfer from Ag to PTCDA as discussed below. (B) O 1s core-level XPS spectra of clean Ag, borophene/Ag, and PTCDA/borophene/Ag (vertically offset). Following PTCDA deposition, two sub-peaks at 530.6 eV and 533.0 eV arise from the C—O—C and C=O bonds in PTCDA. The XPS spectra of clean Ag(111) and borophene/Ag(111) show no evidence of oxygen.
Figure 3B:
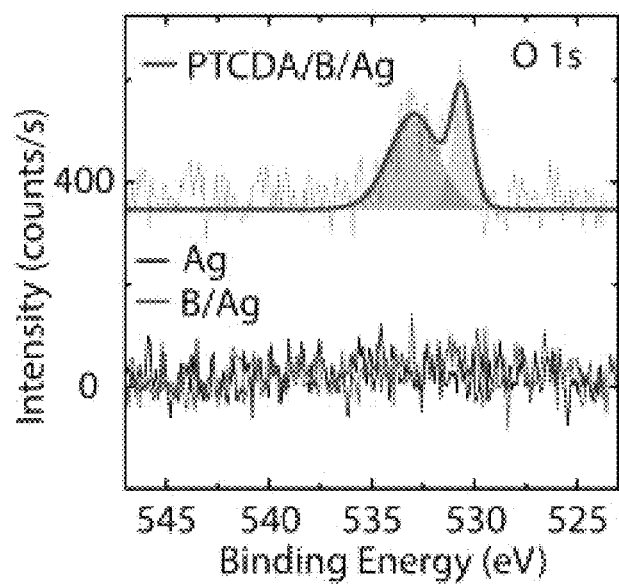

The chemical integrity of the as-grown borophene is probed by in situ XPS, as shown in FIG. 1C. The B 1s core-level spectrum (top) shows a clear pristine boron peak (30) at ~188 eV with no peaks observed at higher binding energies of ~192 eV, which would otherwise correspond to oxidized boron. The pristine nature of borophene is further confirmed by the absence of an oxygen peak in the O 1s core-level spectrum (FIG. 3). The Ag 3d core-level spectra (FIG. 1C, bottom) before and after borophene growth reveal no detectable peak splitting, shifting, or broadening, which suggests the absence of B—Ag alloying and thus the formation of chemically distinct 2D boron layers (FIG. 3). FIG. 1D shows an ex situ atomic force microscopy (AFM) image of borophene after being exposed to air for ~20 min. Triangular-shaped protrusions indicate that the borophene islands are topographically protruding above the Ag surface. The particles observed in the AFM image likely result from boron particles during deposition, ambient-induced contamination, or Ag oxidation.

Figure 4A:
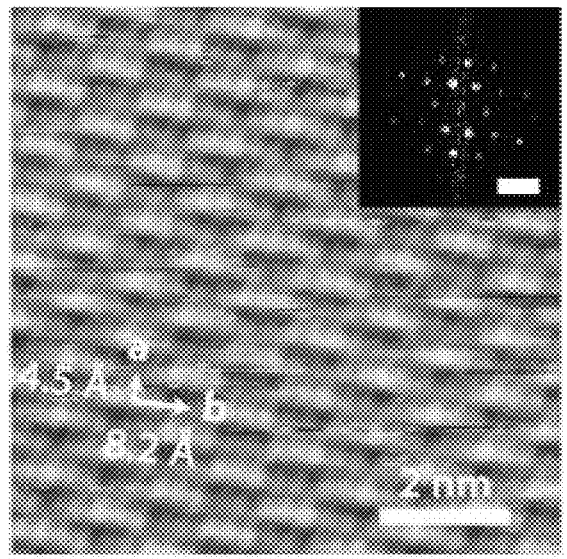
FIGS. 4A-G. Structural and electronic properties of homogeneous-phase borophene. (A) Atomic resolution STM digital image of homogeneous-phase borophene showing the brick-wall structure ($V_s=-1.2$ V, $I_t=2.4$ nA). Inset: fast Fourier transform (FFT) of the image. The scale bar is 2 $nm^{-1}$. (B) STM digital image showing a borophene 60° grain boundary ($V_s=-0.15$ V, $I_t=3.0$ nA). (C) STM digital images showing line defects in borophene. Brick-wall patterns and the line defects are highlighted with ovals and arrows, respectively, in the bottom image ($V_s=-1.1$ V, $I_t=500$ pA). (D) STM digital image showing aligned point defects along a line defect as indicated by the upper and lowest arrows, respectively ($V_s=-60$ mV, $I_t=4.3$ nA). (E) Current-voltage and (F) differential tunneling conductance spectra of Ag(111) and borophene. (G) STS digital maps of borophene on Ag(111) at sample biases of −0.2 V and 0.1 V.
Figure 4B:
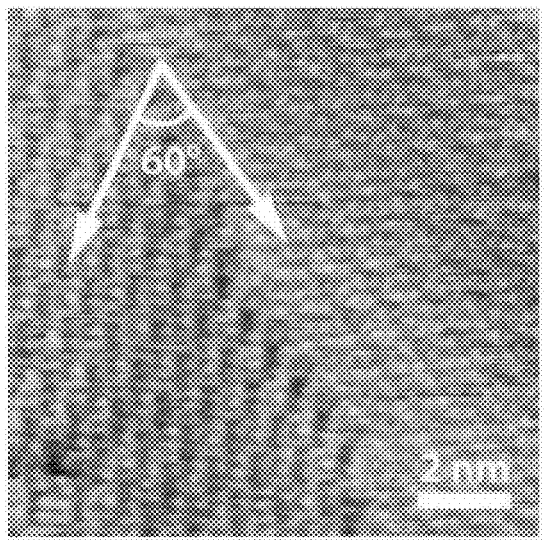
Figure 4C:
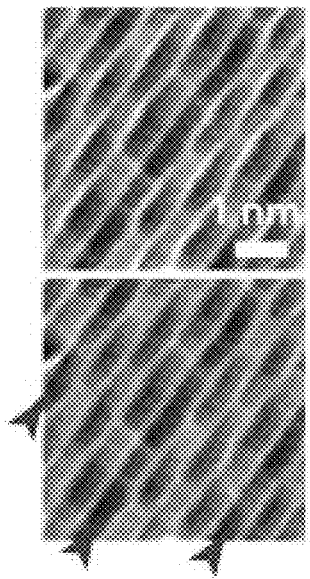
Figure 4D:
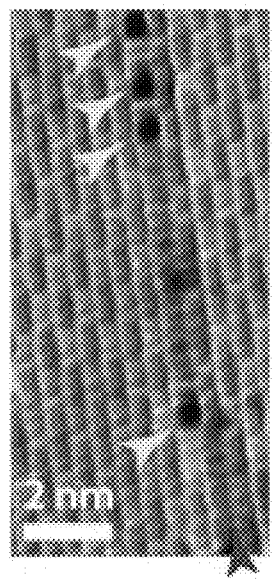
Figure 4E:
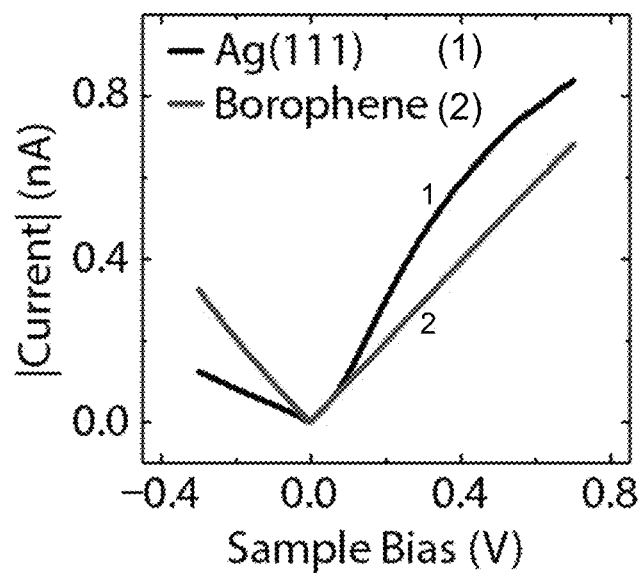
Figure 4F:
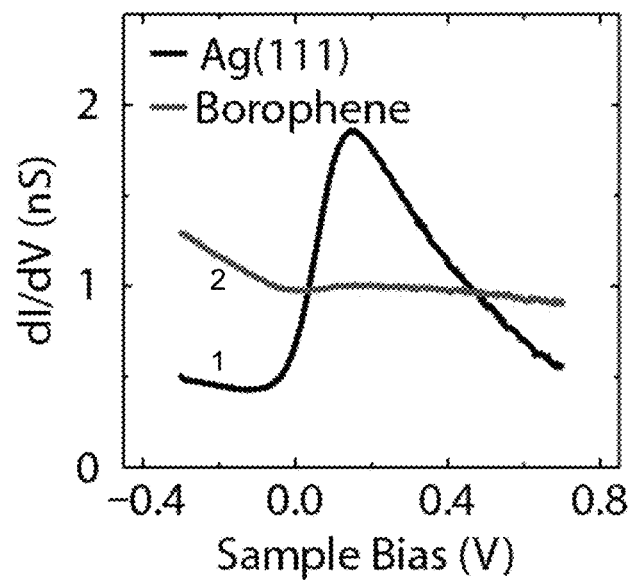
Figure 4G:
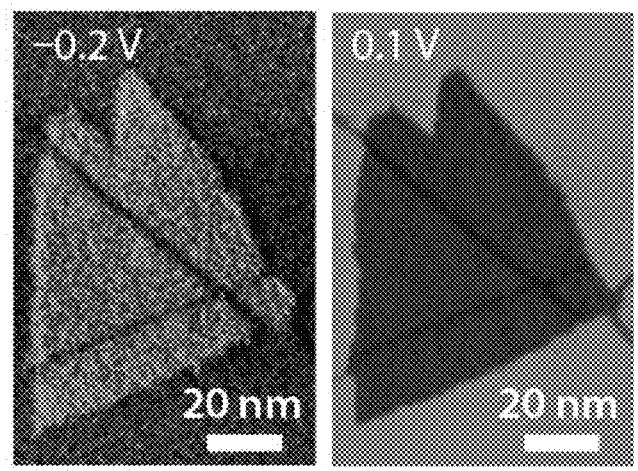
Figure 5A:
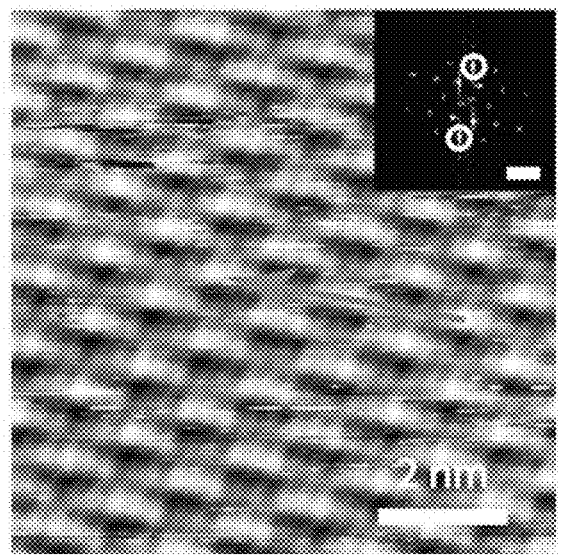
FIGS. 5A-C. Bias-dependent atomic resolution images of homogeneous-phase borophene. STM digital images biasing conditions are (A): $V_b=-1.2$ V, $I_t=2.36$ nA, (B): $V_b=-0.19$ V, $I_t=2.36$ nA, (C): $V_b=-0.27$ V, $I_t=1.45$ nA. The arrows indicate the row directions (i.e., the b direction in FIG. 4A). Insets: fast Fourier transforms of the corresponding real space images. The scale bars are 2 $nm^{-1}$. The white circles indicate the frequency-space points that correspond to the periodic row patterns. Although the brick-wall type structure in (A) is commonly observed, finer structure details dominate the contrast at certain scanning conditions, leading to the brick-wall pattern not being discernable, as shown in (B) and (C).
Figure 5B:
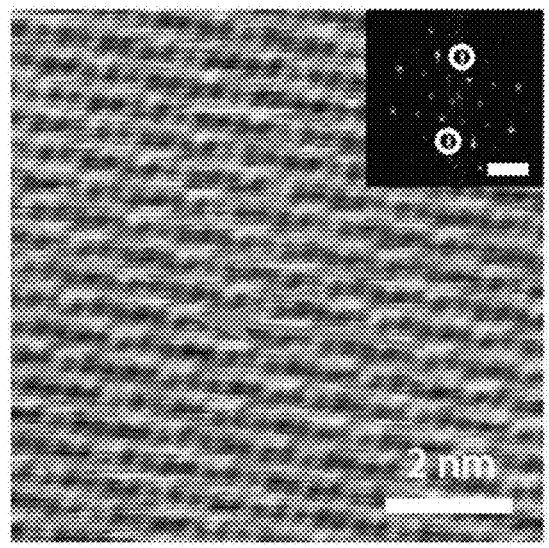
Figure 5C:
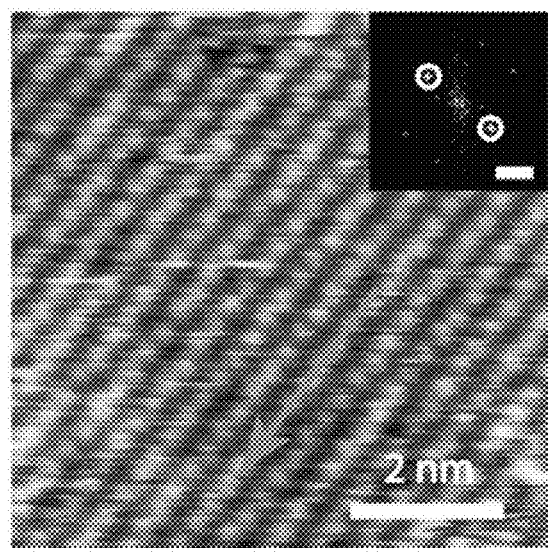

Atomic-scale STM and STS characterization of borophene are provided in FIG. 4. The brick-wall-like structure of homogeneous-phase borophene is shown in FIG. 4A with the inset providing the fast Fourier transform (FFT). The measured inter-row distances are 4.5 Å and 8.2 Å in the labeled a and b directions, which is consistent with previous reports. Although this brick-wall structure has been observed previously, additional atomic-scale contrast is observed at other bias conditions (FIG. 5). A 60° grain boundary of borophene is shown in FIG. 4B, further suggesting that the six-fold symmetry of the Ag(111) substrate templates borophene growth. In addition to grain boundaries, another type of frequently observed one-dimensional defect is provided in FIG. 4C. In the bottom image, the brick-wall patterns and the line defects are highlighted with ovals and arrows, respectively. The line defects are parallel and running along the b direction. Aligned point defects (upper arrows) are also found along these line defects (lowest arrow) as shown in FIG. 4D. The existence of these defects may provide strain relaxation that helps accommodate the lattice mismatch between borophene and Ag(111).

The electronic properties of homogeneous-phase borophene are further interrogated with STS. FIG. 4E shows the current-voltage (I-V) measurements on both borophene and Ag(111), revealing the metallic behavior of borophene. The differential tunneling conductance curves of Ag(111) and borophene are provided in FIG. 4F. Borophene exhibits a nearly constant density of states (DOS) at small positive sample bias, whereas Ag(111) shows a feature that is consistent with literature reports of the known surface state starting below the Fermi level. These electronic differences are further demonstrated in FIG. 4G, where STS mapping over a borophene island at two different biases (−0.2 V and 0.1 V) produces inverted contrast. STS maps over a continuous range of sample biases between −0.3 V and 0.7 V are also available.

Self-Assembly of Borophene/PTCDA Lateral Heterostructures.

Figure 6A:
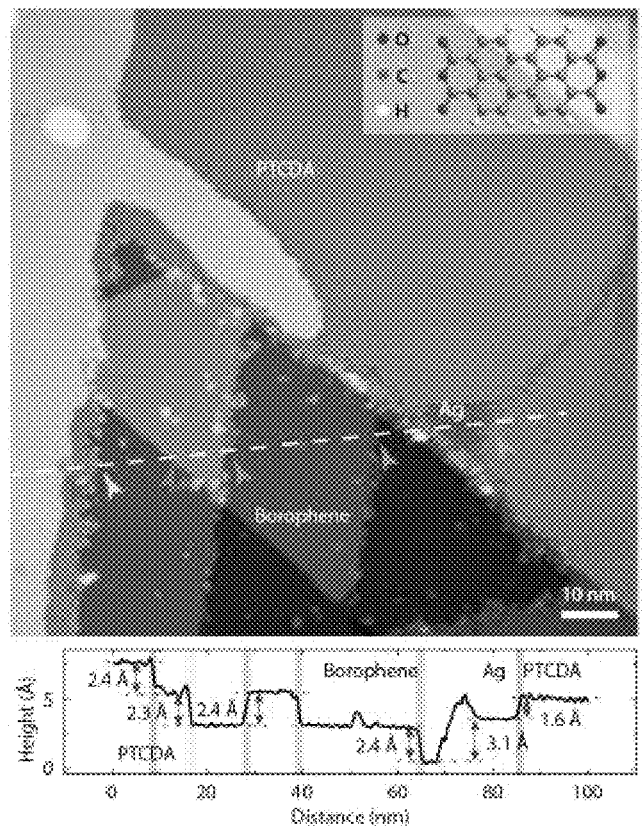
FIGS. 6A-G. Borophene/PTCDA lateral heterostructure. (A) Large-scale STM digital image of a borophene/PTCDA lateral heterostructure and the cross-sectional profile along the white dashed line ($V_s$=−1.7 V, $I_t$=90 pA). Borophene to PTCDA step edges, Ag to PTCDA step edges, and Ag atomic step edges under PTCDA and borophene correspond to the cross-sectional profile, below, and are indicated by the respective arrows. Inset: PTCDA molecule structure. (B) Schematic of a borophene/PTCDA lateral heterostructure. (C) Unit cell schematic of the PTCDA herringbone structure. (D) STM digital image of a borophene/PTCDA lateral heterostructure with the upper, middle and lower boxes indicating regions of PTCDA, borophene, and Ag, respectively ($V_s$=−1.1 V, $I_t$=90 pA). (E to G) STM digital images of the square regions indicated in (D). The pair of arrows indicate the lattice orientations of borophene and Ag(111) ((E): $V_s$=−0.45 V, $I_t$=140 pA, (F): $V_s$=−1.1 V, $I_t$=500 pA, (G): $V_s$=−70 mV, $I_t$=6.1 nA).

The deposition of PTCDA is achieved by thermally evaporating PTCDA molecules from an alumina-coated crucible. Fine-tuning of the evaporation temperature and duration allows precise, layer-by-layer growth of lateral hydrogen-bonded, self-assembled PTCDA on Ag(111). FIG. 6A shows a large-scale STM image following PTCDA deposition onto a submonolayer borophene on Ag(111) substrate. The large triangular-shaped domain at the lower half of the image is a bare borophene island surrounded by a PTCDA monolayer and a small patch of clean Ag(111).

Figure 7A:
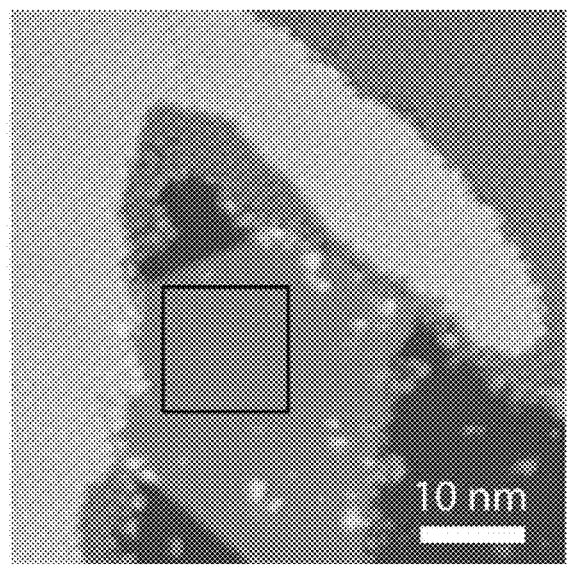
FIGS. 7A-B. Additional atomic resolution image of borophene. (A) STM digital image of the borophene/PTCDA lateral heterostructure in FIG. 6A ($V_b$=−1.7 V, $I_t$=90 pA). (B) Atomic resolution digital image of the borophene region indicated by the square in (A), supporting the assignment of borophene in FIG. 6A. Line and point defects are seen at the top and bottom parts of the image ($V_b$=0.11 V, $I_t$=2.54 nA).
Figure 7B:
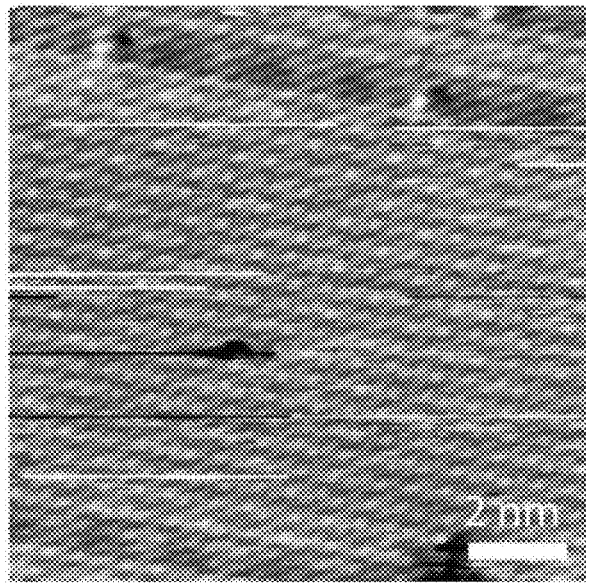

Atomic resolution imaging of this borophene island (FIG. 7) confirms the absence of PTCDA on the borophene surface.

Figure 6B:
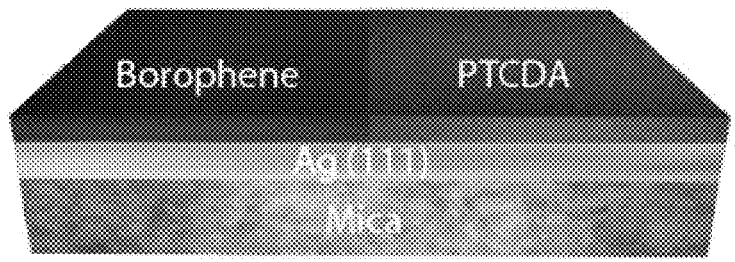
Figure 8A:
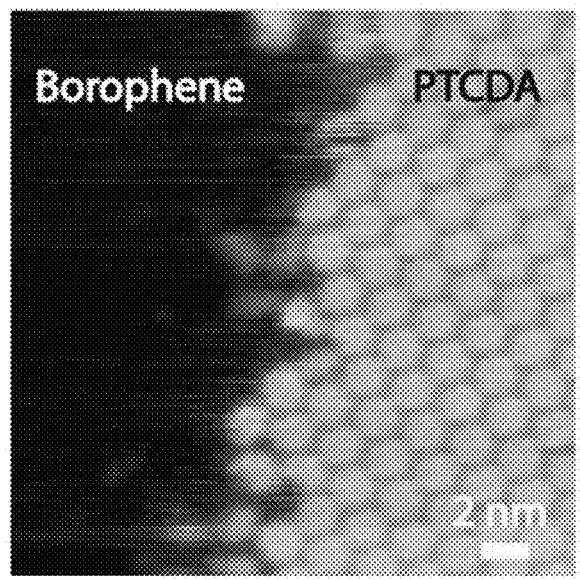
FIGS. 8A-C. STM digital images of growth of PTCDA across various interfaces. (A) Borophene/PTCDA interface. The PTCDA molecules are mobile at the interface due to the perturbation of STM tip and the weak interaction between PTCDA and borophene (Vb=−0.85 V, It=60 pA). (B) Carpet-mode growth of PTCDA across a Ag step edge (Vb=−0.85 V, It=60 pA). (C) The edge of a PTCDA island on Ag(111) (Vb=−1.07 V, It=50 pA).
Figure 8B:
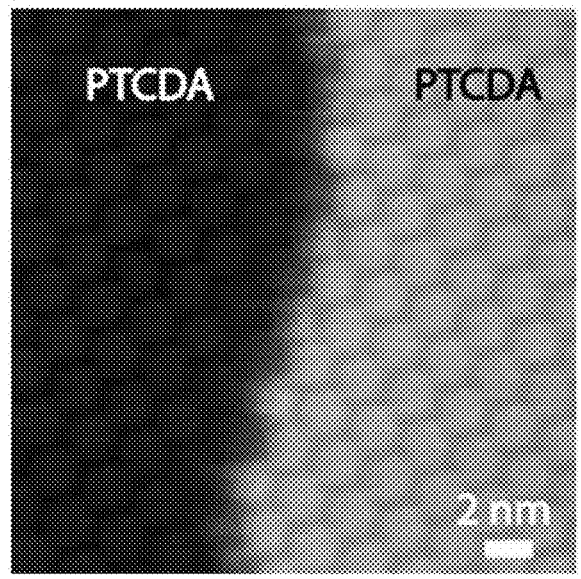
Figure 8C:
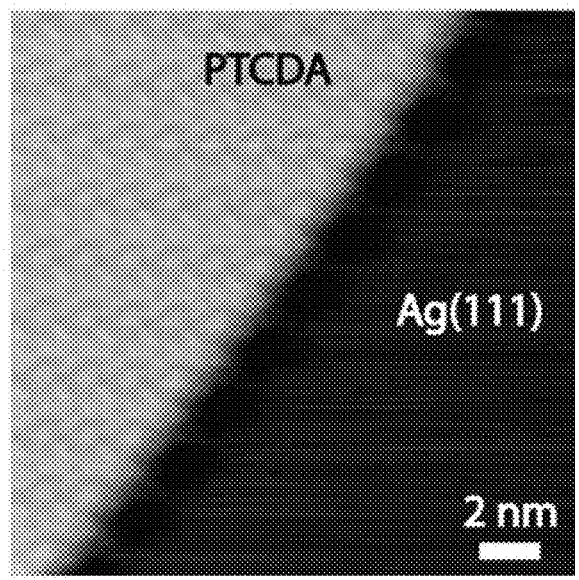
Figure 9A:
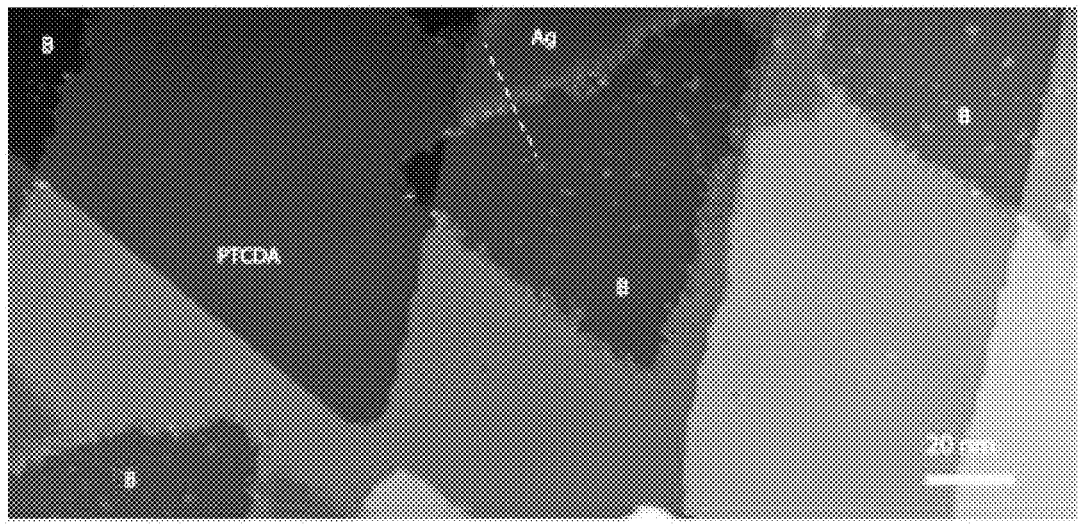
FIGS. 9A-C. Additional digital images (A and C) of PTCDA/borophene lateral heterostructures. (A) Large-scale STM digital image of borophene islands surrounded by PTCDA monolayers ($V_b$=−1.6 V, $I_t$=50 pA). (B) The cross-sectional profile along the white dashed line in (A), which reveals the 0.7 Å apparent step height from borophene to Ag(111). (C) The black arrows indicate PTCDA molecules being dragged along the slow scan direction (top to bottom) on borophene, which is consistent with a weak interaction between PTCDA and borophene ($V_b$=−1.4 V, $I_t$=50 pA).
Figure 9B:
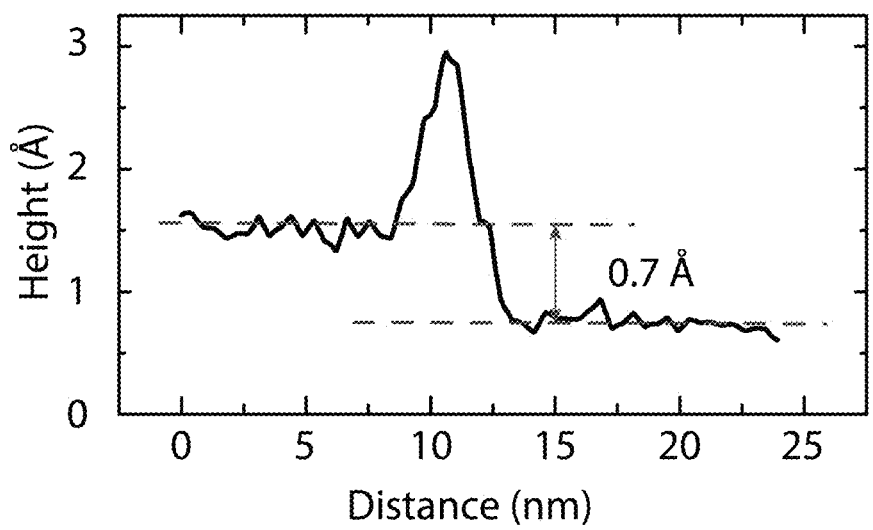
Figure 9C:
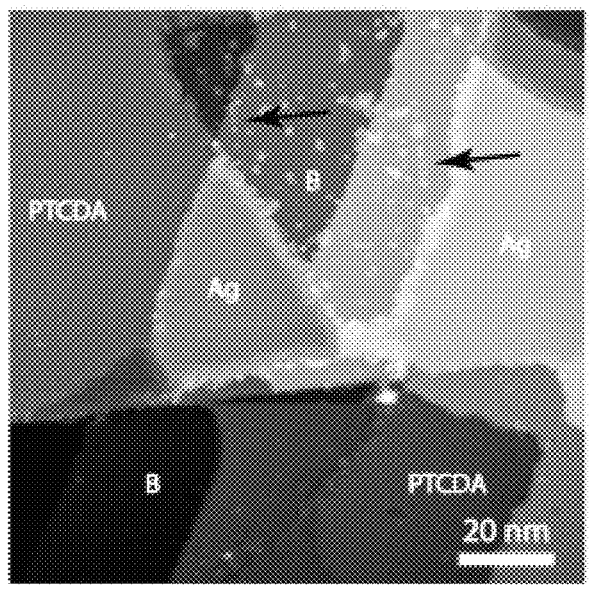

The preferential assembly of PTCDA on Ag(111) compared to borophene leads to the spontaneous formation of borophene/PTCDA lateral heterostructures. Due to the presence of steps in the underlying Ag(111) substrate, the geometry of the borophene/PTCDA lateral heterostructure is better understood through the cross-sectional profile (lower 6A) taken along the white dashed line (upper FIG. 6A), where each step height is labeled and indicated on the STM image by a corresponding arrow. The measured step heights of 2.4 Å across the PTCDA layer and borophene region correspond to a single atomic step height on Ag(111) (2.36 Å) as a result of the carpet-mode growth of PTCDA and borophene over Ag step edges (FIGS. 2 and 8). The apparent step height of 2.3 Å from borophene to monolayer PTCDA is explained by the sum of the 0.7 Å step height from borophene to Ag (111) (FIG. 9) and the 1.6 Å step height from Ag(111) to monolayer PTCDA. Therefore, the borophene/PTCDA lateral heterostructure consists of borophene laterally interfacing with a monolayer of self-assembled PTCDA on Ag(111) as shown schematically in FIG. 6B.

Figure 6C:
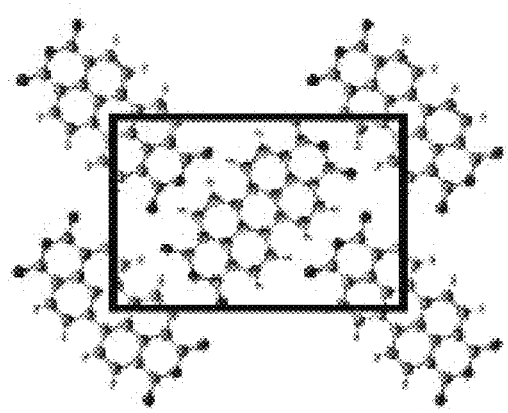
Figure 6D:
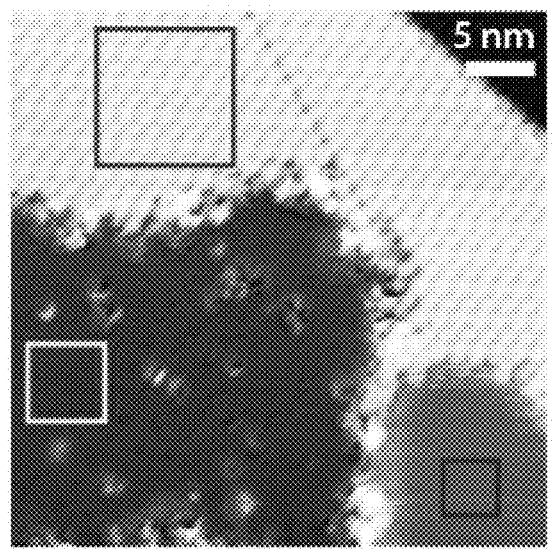
Figure 6E:
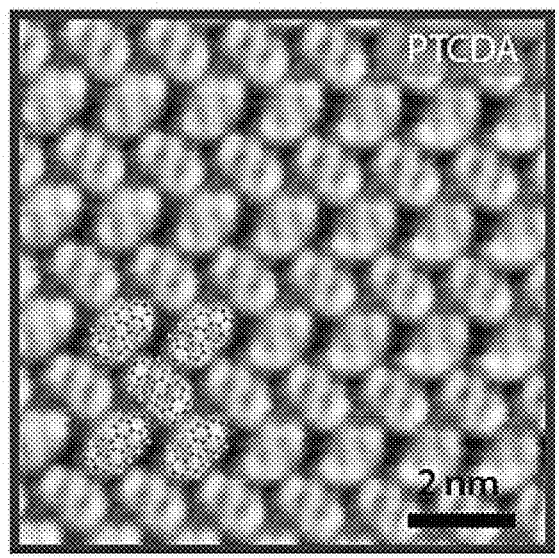
Figure 6F:
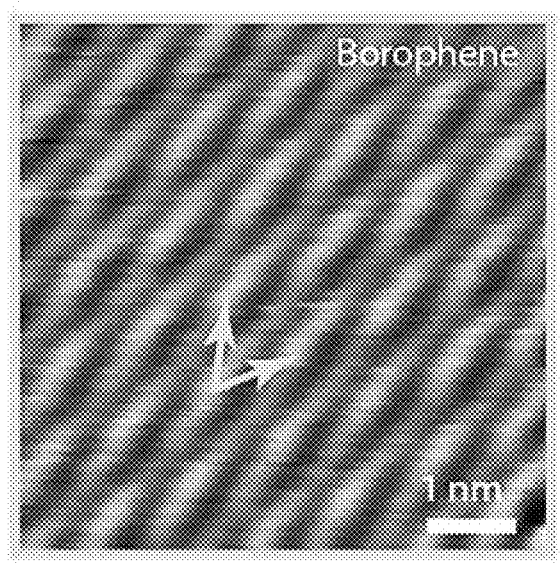
Figure 6G:
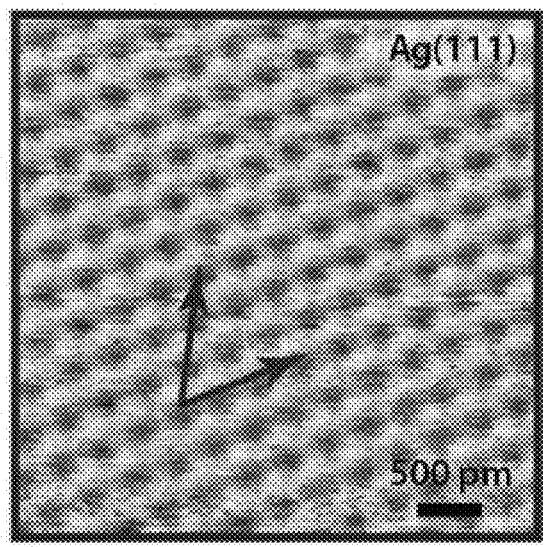

The self-assembly motif adopted by PTCDA on Ag(111) is the well-known herringbone structure. FIG. 6C shows the unit cell of this structure, which is more directly observed in FIG. 6D-E. In particular, the upper, middle and lower squares in FIG. 6D highlight regions of PTCDA, borophene, and bare Ag, respectively. The zoomed-in STM images of each region are shown in FIG. 6E-G, with the unit cell of PTCDA schematically overlaid in FIG. 6E. The relative lattice orientation of homogeneous-phase borophene and Ag(111) is denoted by the pairs of arrows in FIG. 6F-G, which are parallel to each other and thus indicate registry between the two materials. This apparent registry is consistent with the aligned triangular domains in FIG. 1B and the formation of 60° grain boundaries in FIG. 4B as noted above.

Figure 11A:
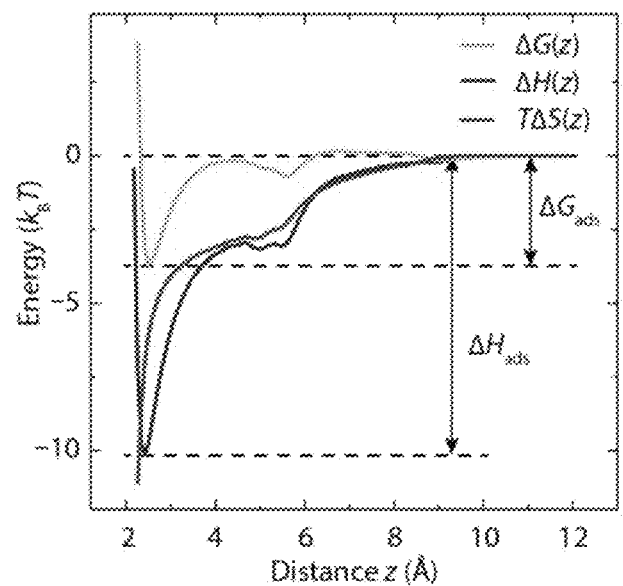
FIGS. 11A-D. Molecular dynamics simulation results. (A) $\Delta G(z)$, $\Delta H(z)$, $T\Delta S(z)$ as a function of center-of-mass distance z to the homogeneous substrate of a single PTCDA molecule with $\Delta H_{ads}$=10 $k_B T$. (B) $\Delta G_{ads}$ and probability ratio of finding a molecule beyond and within a threshold $z_0$=5.635 Å from the substrate, as a function of $\Delta H_{ads}$. (C) Surface coverage as a function of $\Delta H_{ads}$. Inset: simulation snapshots of PTCDA adsorption and self-assembly on homogeneous Ag(111) substrates at different $\Delta H_{ads}$. (D) Self-assembled structure of PTCDA on heterogeneous borophene/Ag(111) substrates with $\Delta H_{ads,B}$=10 $k_B T$, 16 $k_B T$, 18 $k_B T$, and 22 $k_B T$.
Figure 12:
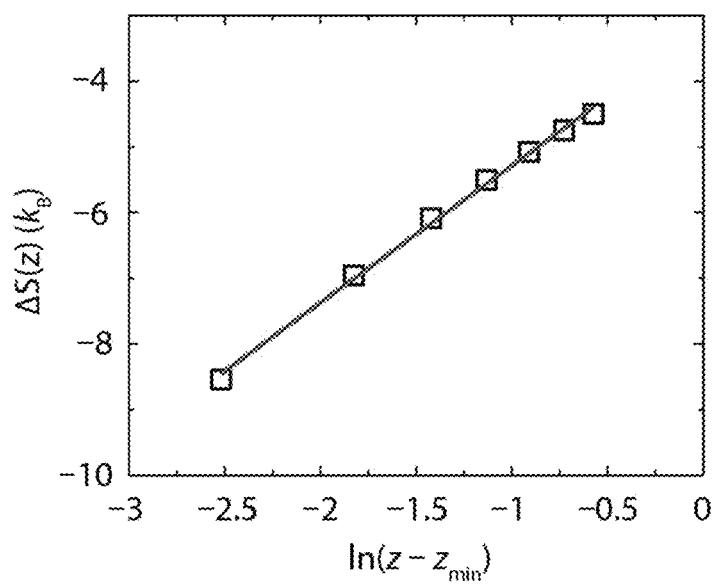
FIG. 12. Entropy variation $\Delta S(z)$ of a single PTCDA molecule as a function of logarithmic distance $\ln(z-z_{min})$ to a homogeneous substrate. $z_{min}$ is the distance at which the central bead of the PCTDA molecule and a Ag atom are touching. When a PTCDA molecule is in close proximity to the substrate, $\Delta S(z)$ decreases logarithmically with surface separation.

Molecular dynamics modeling. To explore the effect of competing adsorption on the self-assembly of molecules on heterogeneous substrates, MD simulations were employed at a fixed temperature T=300 K, which matches the experimental conditions. With large-scale collective effects that are not accessible through ab initio calculations, the PTCDA molecules were reduced to a coarse-grained representation (FIG. 10) capable of forming lateral hydrogen bonds as well as adsorption on the substrate. The Ag(111) substrate is represented as a hexagonally close-packed lattice, with inter-atomic spacing 2.898 Å. The excluded-volume interactions are modeled with shifted-truncated Lennard-Jones (LJ) potentials and the attractions are represented by LJ potentials. (Without limitation to any one theory or mode of operation, modeling studies were undertaken, as outlined, the details of which are described more fully in the Examples, below.) Whereas the hydrogen bonding strength is kept fixed, the enthalpy of adsorption per molecule, $\Delta H_{ads}$, which can be defined as the magnitude of the relative enthalpy $\Delta H(z)=H(z)-H(\infty)$ upon adsorption at $z=z_G$, was systematically varied. The relative Gibbs free energy $\Delta G(z)$ and entropy $\Delta S(z)$ are similarly defined. Here, z is the distance from the substrate and $z_G$ is the position where $\Delta G(z)$ takes its minimum. To set the scale of $\Delta H_{ads}$, the loss of entropy upon adsorption of a single coarse-grained PTCDA molecule via thermodynamic integration was first quantified (see, Example 5). As shown in FIG. 11A, at $\Delta H_{ads}=10$ $k_BT$, a Gibbs free energy of adsorption $\Delta G_{ads}$ of approximately 4 $k_BT$ is found, implying an entropy loss ~6 $k_B$ for a fully adsorbed PTCDA molecule. The functional form of the entropy loss (namely, logarithmic in surface separation $z-z_G$) can be rationalized through estimation of the loss in degrees of freedom upon adsorption (FIG. 12).

Figure 11B:
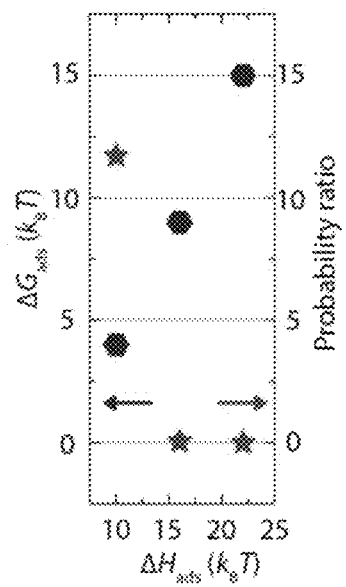
Figure 11C:
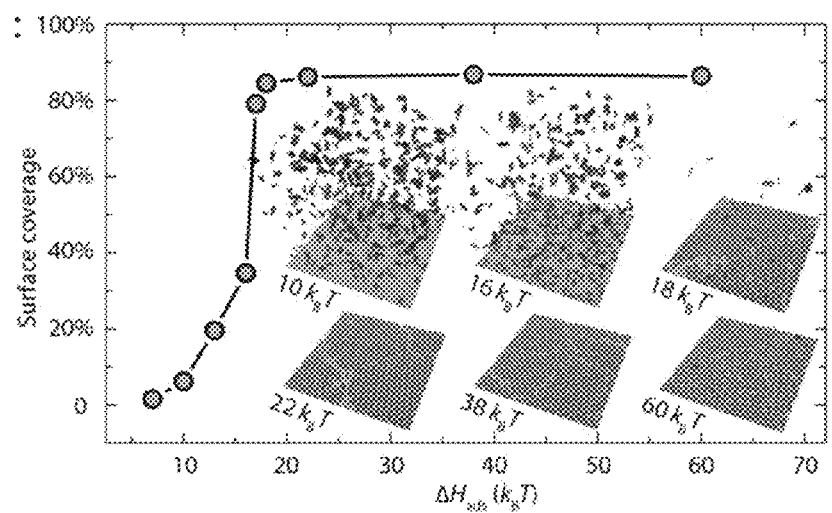
Figure 13:
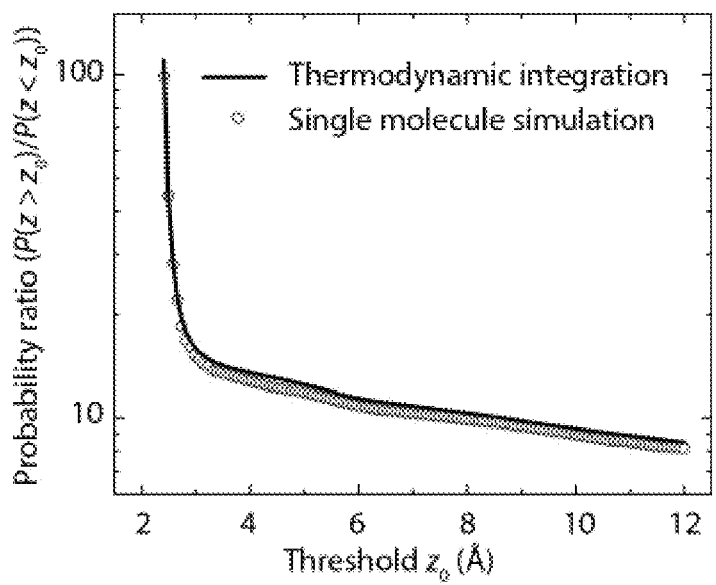
FIG. 13. Probability ratio from thermodynamic integration and single-molecule simulation as a function of threshold z0 at $\Delta H_{ads}$=10 $k_B T$. The result from thermodynamic integration is obtained by integrating $\Delta G(z)$, $$\frac{P(z>z_0)}{P(z<z_0)} = \frac{\int_{z_0}^{z_{max}} e^{-\Delta G(z)} dz}{\int_{z_{min}}^{z_0} e^{-\Delta G(z)} dz}$$

To confirm the calculation of $\Delta G(z)$, the probability of finding a single molecule within a certain distance from the substrate was probed. Specifically, for a threshold $z_0$=5.635 Å, a ratio $P(z>z_0)/P(z<z_0)\approx10.99$ is found, in relatively good agreement with the value 11.76 computed by integration of $\Delta G(z)$ (see FIG. 13 and Example 5). As $\Delta H_{ads}$ is increased from 10 $k_BT$ to 16 $k_BT$ and 22 $k_BT$, $\Delta G_{ads}$ increases accordingly, and the probability of finding a single PTCDA molecule near the surface is greatly enhanced (FIG. 11B). Whereas this follows immediately from the Boltzmann distribution, the situation is more subtle if upon adsorption molecules interact laterally and form a regular surface packing. Thus, self-assembly of PTCDA molecules on a homogeneous Ag(111) substrate is examined as a function of $\Delta H_{ads}$. For molecular adsorption enthalpies of 10 $k_BT$ and 16 $k_BT$, only moderate adsorption levels (FIG. 11C) are found, as expected from the significant entropy loss upon adsorption. As $\Delta H_{ads}$ is increased to 18 $k_BT$, significant surface coverage is observed, with the adsorbed molecules arranged in the herringbone structure found experimentally in FIG. 6D-E (inset of FIG. 11C). Increase of $\Delta H_{ads}$ to 22 $k_BT$ and 38 $k_BT$ does not lead to an appreciable change, but at even higher adsorption enthalpy (60 $k_BT$), a large number of defects are observed. It is noted that these adsorption enthalpies leading to almost full surface coverage are within the range found in density functional theory calculations (0.5-3 eV), and $\Delta H_{ads,Ag}$=38 $k_BT$ is employed for the study of competing adsorption on borophene/Ag(111) surfaces. The abrupt increase in surface coverage as a function of $\Delta H_{ads}$ is consistent with a first-order transition (FIG. 11C).

Figure 11D:
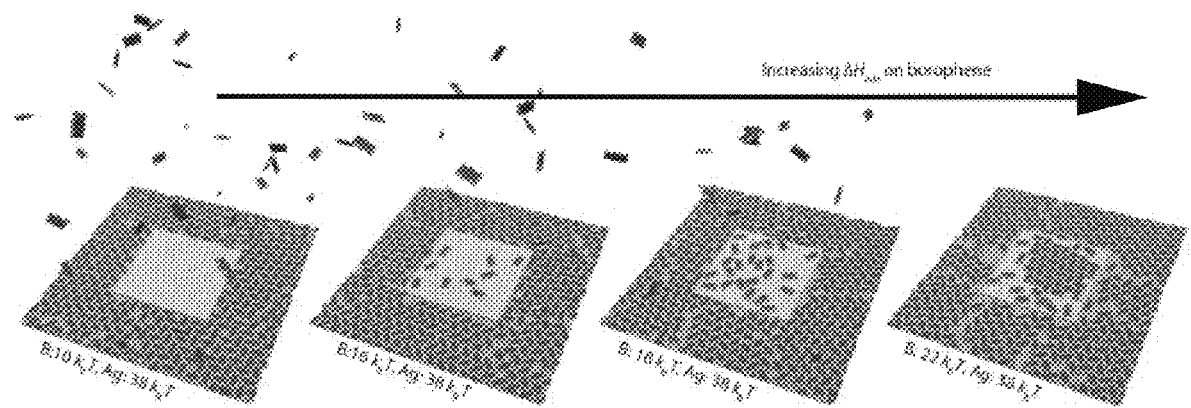

To model the formation of lateral heterostructures on heterogeneous substrates of borophene grown on Ag(111), a second hexagonally close-packed lattice layer partially covering the original substrate is added, to represent a borophene island (islands in FIG. 11D). Within the context of this coarse-grained model and considering that the atomic structure of homogeneous-phase borophene is not well-established, the same structure is chosen for the borophene island, to focus on the energy barriers posed by domain edges and, most importantly, the role of competitive binding. The latter is investigated by fixing $\Delta H_{ads,Ag}$ on Ag(111) at 38 $k_BT$ per molecule, then systematically varying the adsorption enthalpy on borophene, $\Delta H_{ads,B}$. As illustrated in FIG. 11D, PTCDA molecules self-assemble on Ag(111) in all cases and gradually adsorb and self-assemble on the borophene island as $\Delta H_{ads,B}$ is increased. As expected, negligible adsorption takes place for $\Delta H_{ads,B}$ below 18 $k_BT$. However, even for $\Delta H_{ads,B}$=18 $k_BT$, full coverage and self-assembly are found for a homogeneous substrate, and low, unordered coverage occurs on the borophene, owing to the competing adsorption by the Ag(111) substrate. Moreover, the energy barrier at the boundary causes the coverage on Ag(111) to terminate abruptly at the edge of the borophene island. Only when $\Delta H_{ads,B}$ is increased to 22 $k_BT$, self-assembly occurs on both substrates. It is important to note that for the study of competitive binding the total number of PTCDA molecules in the system must be limited to the amount needed for full coverage of the Ag(111). Since the present model does not permit multi-layer adsorption, at higher PTCDA availability adsorption on borophene will occur as well once the Ag(111) is fully covered and $\Delta H_{ads,B}$ is increased to a sufficiently high level. Interestingly, the hydrogen bonding responsible for the formation of the herringbone structure plays a role in suppressing accumulation of PTCDA on the less adsorbing substrate, since at dilute coverage molecules cannot form lateral hydrogen bonds (FIG. 11D, second and third panel). Therefore, within the limitations of the coarse-grained model and the assumption that differences in adsorption are not governed by surface geometry, it is found that a PTCDA adsorption enthalpy on borophene of less than ~16 kBT (0.4 eV), combined with a differential in PTCDA adsorption enthalpy between Ag(111) and borophene of several kBT (~0.1 eV, FIG. 14), is sufficient to fully explain the experimental observations.

Spectroscopy of Borophene/PTCDA Lateral Heterostructures.

Figure 15A:
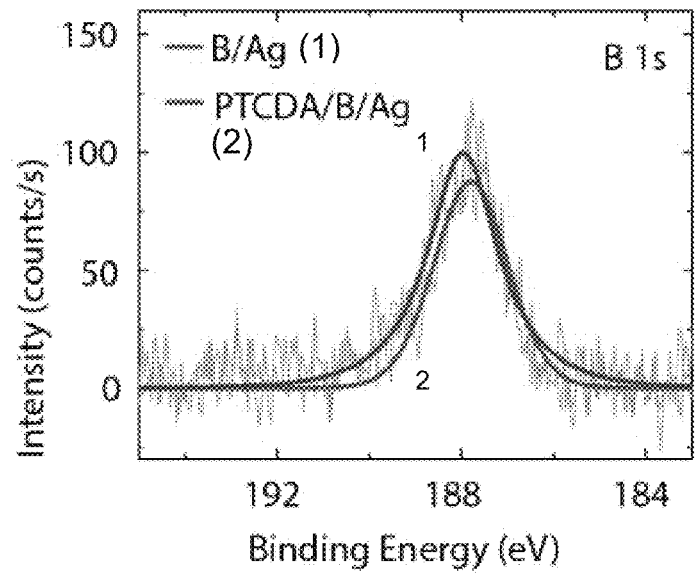
Figure 15B:
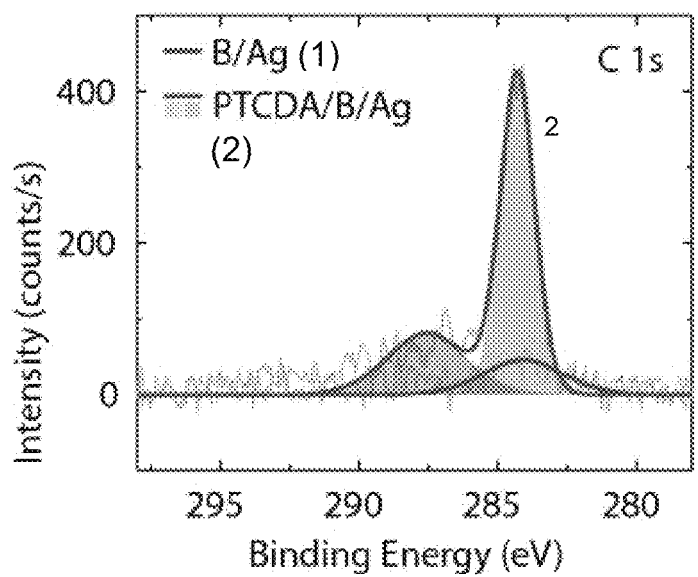
Figure 15C:
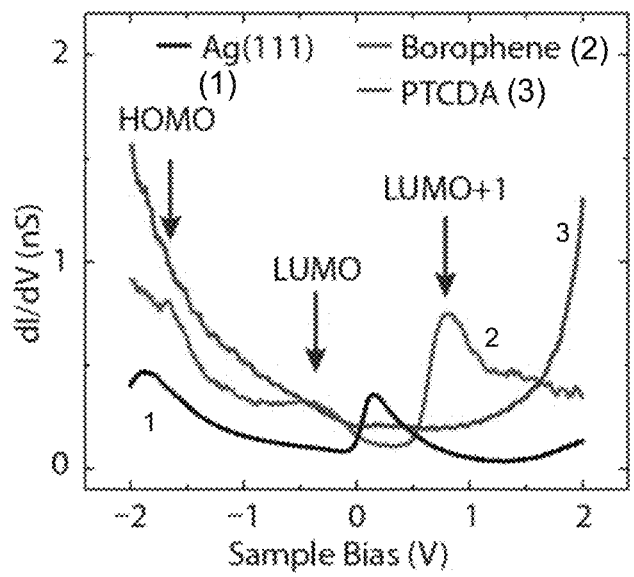

FIG. 15A displays in situ XPS spectra of borophene before and after PTCDA deposition. Consistent with the absence of PTCDA on the borophene surface, the B 1s core-level peak is essentially unchanged following PTCDA deposition with the exception of a small downshift (<0.2 eV) to lower binding energy. On the other hand, in response to the PTCDA monolayer on the surrounding Ag(111) surface, the C is spectrum in FIG. 15B shows a significant increase in peak intensity, where the two sub-peaks at 284.3 eV and 287.6 eV correspond to the perylene core and carbonyl groups in PTCDA. The small presence of C preceding PTCDA deposition can be attributed to trace amounts of adventitious carbon for Ag on mica (FIG. 16). In FIG. 6A, relatively few individual PTCDA molecules are present atop borophene primarily at points that align with underlying Ag step edges. Charge transfer between metallic borophene and these sparsely adsorbed PTCDA molecules, as well as the PTCDA molecules at the borophene/PTCDA lateral heterojunction interface, presumably leads to the minor peak shift in the B 1s core-level spectrum. Consistent with this interpretation, charge transfer between PTCDA and conventional metallic substrates, including Ag, results in the lowest unoccupied molecular orbital (LUMO) shifting below the Fermi level.

Figure 15D:
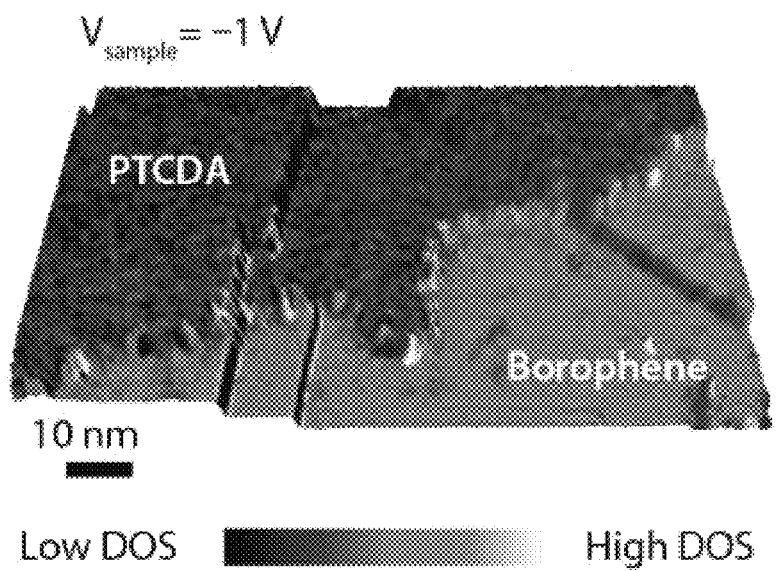
Figure 15E:
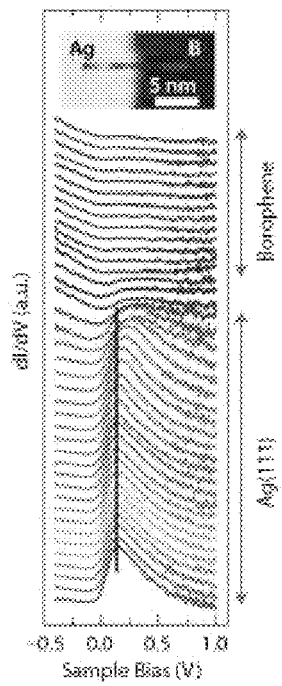
Figure 15F:
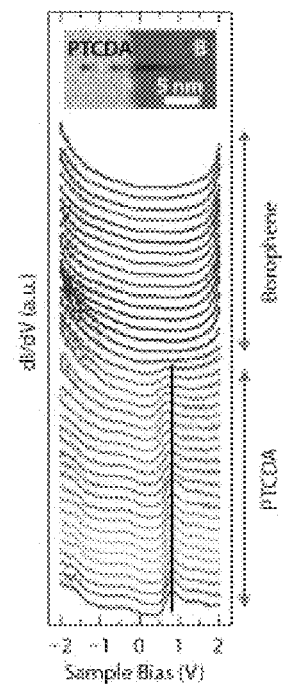

To further probe electronic interactions between borophene and PTCDA, STS characterization is performed on the borophene/PTCDA lateral heterostructure substrate. Specifically, STS spectra are presented in FIG. 15C for clean Ag(111), borophene, and monolayer PTCDA. The lineshape and features for the PTCDA STS spectrum agree well with literature precedent for the highest occupied molecular orbital (HOMO, −1.7 eV), LUMO (−0.3 eV), and LUMO+1 (0.8 eV). FIG. 15D shows a rendered three-dimensional topography image of the lateral heterostructure with superimposed STS mapping at a sample bias of −1 V. The relative electronic DOS between borophene and PTCDA is in agreement with FIG. 15C. The degree of interfacial electronic interaction is further explored by a series of STS spectra taken across both the Ag/borophene and PTCDA/borophene interfaces with lateral displacements of 3.0 Å and 3.8 Å between adjacent points in FIGS. 15E and 15F, respectively. In FIG. 15E, far from the interface, both borophene and Ag(111) show characteristic bulk properties. A small upshift (~0.05 eV) of the Ag surface state feature to higher energy is observed when approaching the interface from Ag(111). The transition in the STS spectra from PTCDA to borophene is abrupt and takes place within 1-2 nm in FIG. 15F, similar to the size of a PTCDA molecule. A small downshift of ~0.15 eV of the LUMO+1 state is observed when approaching the junction from PTCDA, likely due to the weak van der Waals interactions between the junction of PTCDA molecules and borophene. Compared, for instance, to the additional features in the STS spectra of single layer MoS$_2$ and the large transition distance due to the presence of edge states and transition regions at MoS$_2$ edges and grain boundaries, the borophene/PTCDA lateral heterojunction demonstrated through and representative of this invention is surprising and unexpected in terms of its electronic abruptness at the single nanometer length scale.

In summary, representative self-assembled borophene/PTCDA lateral heterostructures with structurally and electronically abrupt interfaces have been realized by sequential deposition of B and PTCDA on Ag(111). The borophene/PTCDA lateral heterostructures occur spontaneously, which is consistent with molecular dynamics simulations that show that a higher enthalpy of adsorption on Ag(111) and the lateral hydrogen bonding between adsorbed PTCDA molecules leads to preferential assembly of PTCDA on Ag(111) compared to borophene. The weak chemical interaction between borophene and PTCDA is further corroborated by in situ XPS measurements. Molecular-resolution STM/STS shows that borophene/PTCDA lateral heterostructures are electronically abrupt with a transition in the DOS from borophene to PTCDA occurring over the length scale of a single PTCDA molecule.

EXAMPLES OF THE INVENTION

The following non-limiting examples and data illustrate various aspects and features relating to the articles and/or methods of the present invention, including the assembly of boron allotrope or borophene/organic heterostructures, as are available through the synthetic methodologies described herein. In comparison with the prior art, the present articles and methods provide results and data which are surprising, unexpected and contrary thereto. While the utility of this invention is illustrated through the use of several articles, organic components and substrates which can be used therewith, it will be understood by those skilled in the art that comparable results are obtainable with various other articles, organic components and substrates, as are commensurate with the scope of this invention.

Example 1

Growth of borophene/PTCDA lateral heterostructures. All growth is performed in a UHV preparation chamber (pressure <10$^{-9}$ Torr) that is directly connected to a loadlock, STM, and XPS system. Ag(111) thin films (~300 nm thick) on mica substrates (Princeton Scientific Corp.) are cleaned by repeated Ar ion sputtering at 3.3×10$^{-6}$ Torr (30 min) followed by annealing at 550° C. (30 min). The deposition of boron is achieved by electron-beam evaporation (SPECS EBE-1) of a pure boron rod (ESPI metals, 99.9999% purity) onto the cleaned Ag(111) substrates held at 480° C. The deposition flux is measured by the flux electrodes of the evaporator and is maintained at 20 to 28 nA with a filament current of ~5.8 A and accelerating voltage of 1.3 to 1.6 kV. The typical deposition time is 20-30 min to achieve sub-monolayer coverage of borophene. The electron-beam evaporator is housed in a separately pumped chamber with a base pressure of 8×10$^{-11}$ Torr, and the boron rod is degassed for >6 hr preceding evaporation. (The preparation and characterization of borophene and/or a boron allotrope comprising an elemental boron layer comprising a boron atomic thickness dimension is further described in co-pending application Ser. No. 15/430,885 filed Feb. 13, 2017, at but not limited to paragraph [0049] therein and discussions related thereto, the entirety of such co-pending application is incorporated herein by reference.) The deposition of PTCDA is achieved by thermally evaporating pure PTCDA molecules (Sigma-Aldrich, 97% purity) in an alumina-coated crucible (R. D. Mathis) in the loadlock chamber ($2\times10^{-9}$ Torr) with a heating current of 4.8 A. The molecules are degassed overnight at 2.5 A preceding evaporation. After ramping the current to 4.8 A over 6 min, an exposure time of 1 min results in monolayer coverage on Ag(111) substrates, which are maintained at room temperature during deposition.

Example 2

Scanning Tunneling Microscopy and Spectroscopy.

A home-built UHV STM (~$10^{-10}$ Torr) is used for STM/STS characterization at room temperature with a Lyding-design microscope. (See, E. T. Foley, N. L. Yoder, N. P. Guisinger, M. C. Hersam, Cryogenic variable temperature ultrahigh vacuum scanning tunneling microscope for single molecule studies on silicon surfaces, Rev. Sci. Instrum. 75, 5280-5287 (2004). However, conventional, commercially-available instrumentation can be used with comparable effect.) The bias voltage is applied to the sample with respect to the electrochemically etched PtIr tip (Keysight). The piezo-scanner is calibrated against the Ag(111) lattice (x-y) and atomic step height (z). Nanonis (SPECS) control electronics are used for data collection. STS measurements are carried out with a lock-in amplifier (SRS model SR850) with 30 mV$_{RMS}$ amplitude and ~8.5 kHz modulation frequency. Stable and reproducible spectroscopy was achieved following tip conditioning that includes controlled touching of the STM tip to the Ag(111) surface. This process likely leads to the transfer of Ag atoms to the tip apex, which allows for reproducible room temperature spectra on Ag(111), borophene, and PTCDA that are consistent with literature reports.

Example 3

X-Ray Photoelectron Spectroscopy.

In situ XPS spectra are taken with an Omicron DAR 400 M X-ray source (Al Kα), XM 500 X-ray monochromator, and EA 125 energy analyzer in a UHV chamber ($3\times10^{-10}$ Torr) that is integrated with the STM system and preparation chamber. The XPS energy resolution is 0.6 eV using a pass-energy of 20 eV for core-level spectra. Modified Shirley backgrounds have been subtracted using Avantage (Thermo Scientific) software. Given the trace amount of adventitious carbon for the clean Ag(111) surface (FIG. 16), all peaks are fitted after calibrating the spectra to the Ag $3d_{5/2}$ core-level peak (368.2 eV). This calibration is validated by <0.04 eV changes of the raw Ag $3d_{5/2}$ peaks (FIG. 3) for clean Ag(111), borophene/Ag(111), and PTCDA/borophene/Ag(111) in consecutive runs.

Example 4

Atomic force microscopy. Ambient AFM characterization is carried out on an Asylum Cypher AFM in tapping mode. Si cantilevers from NanoWorld (NCHR-W) are used with a resonant frequency of ~300 kHz. The scanning rate is ~1.5 Hz.

Example 5

Molecular Dynamics Simulations.

The Ag(111) substrate is represented by a hexagonally close-packed lattice of spherical beads with diameter and inter-atomic spacing $\sigma_{Ag}$=2.898 Å. The coarse-grained PTCDA molecule is modeled through a rigid, rectangular collection of 9×5 spherical beads (FIG. 10), designed based upon the hydrogen bonding network and unit cell of the self-assembled herringbone structure (FIG. 6). The diameter of all PTCDA beads is chosen as σ=1.61 Å (with σ the LJ unit of length), so that the lateral dimensions of the modeled unit cell closely correspond to the experimental dimensions. Only the beads capable of forming hydrogen bonds in self-assembled PTCDA molecules (FIG. 10) have an attractive interaction with the Ag atoms. This attraction is represented by a LJ potential, with effective length $\sigma_{i,j}=(\sigma_i+\sigma_j)/2$, where $\sigma_{i,j}=\sigma_{Ag}$ or σ and cutoff of 5.635 Å (shifted to eliminate the LJ potential discontinuity). The adsorption enthalpy of PTCDA is varied by tuning strength of the LJ potential. All other units in a PTCDA molecule interact with the substrate via a purely repulsive LJ potential with the same effective length and cutoff of 2.53 Å (again shifted to eliminate a discontinuity in the potential).

Figure 10:
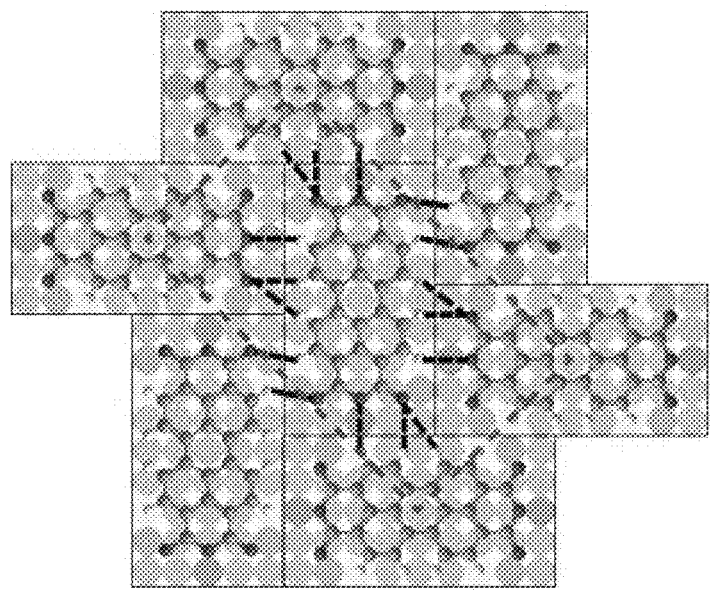
FIG. 10. Design of a coarse-grained model for PTCDA. The design is based upon the hydrogen bonding network (black dashed lines) and unit cell (dashed rectangle) of a self-assembled herringbone lattice.

Further details of the molecule modeling can be understood in conjunction with FIG. 10. As illustrated in FIG. 10, three hydrogen bonds form when the short end of a PTCDA molecule interacts with the side of another molecule. In the PTCDA model, two oxygen beads (purple) at the center of the short sides and four hydrogen beads (yellow) at the long sides are assigned, and the attraction between a pair of oxygen (purple) and hydrogen (yellow) beads are used to represent the effective interaction resulting from the three hydrogen bonds. Similarly, two hydrogen bonds form when the side of a PTCDA molecule interacts with the side of another molecule. Since this double bond can occur at four sides, another four oxygen beads (green) are assigned at the long sides of the molecule, and the attraction between a pair of oxygen (green) and hydrogen (yellow) beads are used to represent one hydrogen bond. Thus, the six oxygen beads (green and purple) in the coarse-grained model represent the oxygen atoms in the end groups of a PTCDA molecule, and the four hydrogen beads (yellow) represent the hydrogen atoms at the sides of a PTCDA molecule. The attraction strengths for hydrogen beads with purple oxygen and green oxygen beads are set to 5 kBT and 5/3 kBT, respectively, giving each hydrogen bond strength of 5/3 kBT, which is within the range of C—H . . . O hydrogen bond strength. The cutoff for the LJ potential is chosen as 4.025 Å (2.5σ) and shifted to eliminate the discontinuity at the cutoff. All other components in PTCDA molecules interact via purely repulsive LJ potential with cutoff at 1.807 Å (21/6σ, also shifted to eliminate the discontinuity). The electric quadrupole nature of PTCDA makes direct stacking of PTCDA molecules unfavorable, which is modeled by placing four virtual beads in the middle of the four sides of a PTCDA molecule. In the simulation, the aim is to probe the effect of heterogeneous substrates on the monolayer growth of PTCDA molecules, thus the virtual bead sizes are chosen to suppress multilayer growth. These virtual beads also account for the repulsive interactions between the negatively polarized anhydride groups of two adjacent molecules, as well as the positively polarized perylene cores of two adjacent molecules, which prevent head-to-head and side by-side assemblies, as experimentally observed. The two virtual beads on the short sides only interact with each other via a purely repulsive LJ potential with σ1=5.796 Å. Likewise, the two beads on the long sides only interact with each other via the same potential with σ2=6.44 Å. The interaction strengths are set to kBT and the interaction cutoffs are set to 21/6σ1 and 21/6σ2, respectively (shifted to eliminate the discontinuity). The tuning of adsorption enthalpy is achieved by varying the interaction strength between silver atoms and the oxygen and hydrogen beads in PTCDA molecules.

For the study of self-assembly of PTCDA on heterogeneous borophene/Ag(111) substrates, 350 molecules are placed in a simulation box with dimensions $(231.84 \text{ Å})^3$ and periodic boundary conditions in the x and y directions. At the upper and lower z boundaries, purely repulsive LJ walls are placed. The center of the Ag(111) substrate is placed 1.61 Å above the lower z boundary and the center of the borophene layer is placed 4.508 Å above the lower z boundary. For the study of self-assembly of PTCDA on homogeneous Ag(111) substrates, 400 molecules are placed in a simulation cell of the same size.

The LAMMPS package is used to perform the MD simulations. The equations of motion are integrated using the velocity-Verlet algorithm. A Langevin thermostat is applied with temperature $1.0\varepsilon/k_B$ and damping time $5\tau$, where $\varepsilon$ and $\tau$ are the LJ units of energy and time, respectively. The time step is set to $0.01\tau$. Each simulation runs for a period of 1 to $4 \times 10^6 \tau$ to reach equilibrium.

To calculate the relative Gibbs free energy $\Delta G(z)$, the center of a single PTCDA molecule is placed at a distance z from the substrate (and centered above a Ag atom), where z is varied from 11.914 Å to 2.254 Å with step size 0.0805 Å. At each z, a canonical MD simulation is performed with the center of mass of the molecule fixed to obtain the average force along the z direction (average forces along x and y directions are confirmed to average out to zero) on the PTCDA molecule. Integration of this ensemble-averaged force with respect to distance from 11.914 Å to 2.254 Å yields the Gibbs free energy as a function of z with respect to the Gibbs free energy of a molecule far from the surface (i.e., in free vacuum).

We claim:

1. An article of manufacture, comprising:
   a silver substrate;
   a boron allotrope comprising an elemental boron layer of boron atoms comprising a boron atomic thickness dimension; and
   an organic compound layer, said boron allotrope and said organic compound layer coupled to said silver substrate, laterally adjacent one to the other and providing a lateral interface one with the other.

2. The article of claim 1 wherein said boron allotrope is borophene.

3. The article of claim 1 wherein said organic compound layer comprises a self-assembly product of perylene-3,4,9,10-tetracarboxylic dianhydride (PTCDA).

4. The article of claim 1 wherein said silver substrate comprises single crystal Ag(111).

5. The article of claim 4 wherein said boron allotrope comprises a homogeneous boron phase.

6. The article of claim 5 wherein said boron allotrope is metallic.

7. The article of claim 6 wherein said organic compound is semiconducting.

8. The article of claim 7 wherein said organic compound is PTCDA.

9. An article of manufacture, comprising:
   a silver substrate;
   a metallic boron allotrope comprising an elemental boron layer of boron atoms comprising a boron atomic thickness dimension; and
   a semiconducting organic compound monolayer comprising a self-assembly product of PTCDA, said boron allotrope and said organic compound layer coupled to said silver substrate, laterally adjacent one to the other and providing a non-covalent lateral interface one with the other.

10. The article of claim 9 wherein said boron allotrope is borophene.

11. The article of claim 9 wherein said silver substrate comprises single crystal Ag(111).

12. The article of claim 9 wherein said boron allotrope comprises a homogeneous boron phase.

13. An article of manufacture, comprising:
    a silver substrate;
    a boron allotrope comprising an elemental boron layer of boron atoms comprising a boron atomic thickness dimension; and
    an organic compound layer, said boron allotrope substantially absent said organic compound thereupon, said boron allotrope and said organic compound layer coupled to said silver substrate, laterally adjacent one to the other and providing a lateral interface one with the other, said lateral interface characterized by complete structural and electronic transition from said boron allotrope to said organic compound layer over the nanometric length scale of said organic compound.

14. The article of claim 13 wherein said boron allotrope is borophene.

15. The article of claim 13 wherein said organic compound layer comprises a self-assembly product of perylene-3,4,9,10-tetracarboxylic dianhydride (PTCDA).

16. The article of claim 13 wherein said silver substrate comprises single crystal Ag(111).

17. The article of claim 16 wherein said boron allotrope comprises a homogeneous boron phase.

18. The article of claim 17 wherein said boron allotrope is metallic.

19. The article of claim 18 wherein said organic compound is semiconducting.

20. The article of claim 19 wherein said organic compound is PTCDA.

* * * * *